(12) United States Patent
Nishikawa et al.

(10) Patent No.: US 10,126,145 B2
(45) Date of Patent: Nov. 13, 2018

(54) PHYSICAL QUANTITY SENSOR DEVICE AND METHOD OF ADJUSTING PHYSICAL QUANTITY SENSOR DEVICE

(71) Applicant: FUJI ELECTRIC CO., LTD., Kawasaki-shi (JP)

(72) Inventors: Mutsuo Nishikawa, Matsumoto (JP); Katsuyuki Uematsu, Hata-machi (JP); Kazuhiro Matsunami, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 404 days.

(21) Appl. No.: 14/642,457

(22) Filed: Mar. 9, 2015

(65) Prior Publication Data

US 2015/0303935 A1    Oct. 22, 2015

(30) Foreign Application Priority Data

Apr. 16, 2014 (JP) ................. 2014-085021

(51) Int. Cl.
| | | |
|---|---|---|
| *H03M 1/10* | (2006.01) | |
| *G01D 3/036* | (2006.01) | |
| *G01D 3/02* | (2006.01) | |

(52) U.S. Cl.
CPC ........... *G01D 3/0365* (2013.01); *G01D 3/022* (2013.01); *H03M 1/10* (2013.01)

(58) Field of Classification Search
CPC ...... G01D 3/0365; G01D 3/022; G05B 15/02; H03M 1/0004; H03M 1/12; H03M 1/182; H04B 1/0475; G01K 15/005
See application file for complete search history.

(56) References Cited

U.S. PATENT DOCUMENTS

| | | | | |
|---|---|---|---|---|
| 2001/0004215 A1* | 6/2001 | Kubota | ................. | F02D 11/106 |
| | | | | 324/685 |
| 2003/0101809 A1 | 6/2003 | Matsumura et al. | | |
| 2010/0259285 A1* | 10/2010 | Koli | ...................... | G01P 15/125 |
| | | | | 324/686 |

(Continued)

FOREIGN PATENT DOCUMENTS

| | | |
|---|---|---|
| JP | H07281834 A | 10/1995 |
| JP | H10-145231 A | 5/1998 |

(Continued)

*Primary Examiner* — Eric Ward
*Assistant Examiner* — Eric Ashbahian
(74) *Attorney, Agent, or Firm* — Rabin & Berdo, P.C.

(57) ABSTRACT

An analog signal is supplied to a first conversion section of a physical quantity sensor device, converted to digital, and set to be an initial output value of the first conversion section. Adjustment information for the first conversion section is calculated based on the error between the initial output value and a target output value of the first conversion section. Before an initial output value of a physical quantity sensor is measured for calculating initial setting information of a physical quantity sensor device, the first conversion section is adjusted based on the adjustment information. Also, a digital signal is supplied to a second conversion section of the physical quantity sensor device, converted to analog, and set to be an initial output value of the second conversion section. The second conversion section is adjusted based on adjustment information for the second conversion section.

7 Claims, 12 Drawing Sheets

(56) References Cited

U.S. PATENT DOCUMENTS

| | | |
|---|---|---|
| 2012/0200438 A1 | 8/2012 | Mori et al. |
| 2014/0198820 A1* | 7/2014 | Sundstrom ............... G01K 7/24 |
| | | 374/1 |
| 2014/0254717 A1* | 9/2014 | Schulte ................ H04B 1/0475 |
| | | 375/296 |
| 2014/0358317 A1 | 12/2014 | Nishikawa et al. |

FOREIGN PATENT DOCUMENTS

| | | |
|---|---|---|
| JP | 2003-032108 A | 1/2003 |
| JP | 2003-166865 A | 6/2003 |
| JP | 2012-165298 A | 8/2012 |
| WO | WO-2013/100156 A1 | 7/2013 |

* cited by examiner

FIG. 3

| MODE No. | DESCRIPTION OF OPERATION |
|---|---|
| 1 | RESPECTIVE INITIAL OUTPUT VALUES OF PHYSICAL QUANTITY SENSOR, TEMPERATURE SENSOR, AND Vcc VOLTAGE DIVIDER SECTION ARE CONVERTED TO DIGITAL BY A/D CONVERTER AND OUTPUT FROM DIGITAL I/O. |
| 2 | RESULT COMPUTED BY COMPUTING CIRCUIT IS OUTPUT FROM DIGITAL I/O. |
| 3 | RESULT COMPUTED BY COMPUTING CIRCUIT IS CONVERTED TO ANALOG BY D/A CONVERTER AND OUTPUT FROM ANALOG I/O. |
| 4 | INFORMATION INPUT FROM DIGITAL I/O IS WRITTEN IN DATA STORAGE SECTION. |
| 5 | VOLTAGE SIGNAL INPUT FROM ANALOG I/O IN INPUT MODE IS CONVERTED TO DIGITAL BY A/D CONVERTER AND OUTPUT FROM DIGITAL I/O IN OUTPUT MODE. |
| 6 | VOLTAGE SIGNAL INPUT FROM DIGITAL I/O IN INPUT MODE IS CONVERTED TO ANALOG BY D/A CONVERTER AND OUTPUT FROM ANALOG I/O IN OUTPUT MODE. |

PHYSICAL QUANTITY SENSOR DEVICE AND METHOD OF ADJUSTING PHYSICAL QUANTITY SENSOR DEVICE

CROSS-REFERENCE TO RELATED APPLICATION

This application claims the benefit of foreign priority of Japanese patent application 2014-085021, filed Apr. 16, 2014, the disclosure of which is incorporated herein by reference.

BACKGROUND OF THE INVENTION

1. Field of the Invention

The present invention relates to a physical quantity sensor device and a method of adjusting the physical quantity sensor device.

2. Description of the Background Art

Heretofore, as a physical quantity sensor device, for example, a digital computation type of physical quantity sensor device, which corrects an output value of a physical quantity sensor element by converting an analog signal, output from the physical quantity sensor element, to a digital signal with an A/D converter (ADC: Analog-to-Digital Converter) and carrying out a computation using a digital computing circuit such as a CPU (Central Processing Unit) or a DSP (Digital Signal Processor), is known.

As the physical quantity sensor device, the present inventors propose the following device. After a second-order first characteristic expression showing a corrected output characteristic of a physical quantity sensor (sensor element) is calculated, and a first characteristic value is extracted, based on an initial output value and target output value of the physical quantity sensor, a second characteristic expression for correcting the first characteristic value is calculated, and a second characteristic value is extracted, based on a predetermined temperature and the first characteristic value. Further, the corrected output value of the physical quantity sensor is computed based on the first characteristic expression corrected by inputting the second characteristic value into the second characteristic expression, and a result of the computation is output as a digital signal (for example, refer to WO2013/100156).

A detailed description will be given of the physical quantity sensor device of WO2013/100156. FIG. 9 is a block diagram showing a functional configuration of a heretofore known physical quantity sensor device. A heretofore known physical quantity sensor device 1100 is an integrated circuit (IC) configured of a physical quantity sensor 1101, a temperature sensor (sensor element) 1102, a Vcc voltage divider section 1103, a computing section 1104, a storage section 1105, and an input/output section 1106. A setting device 1110 calculates initial setting information (first and second characteristic values) for correcting an output value of the physical quantity sensor device 1100, and outputs the initial setting information to the input/output section 1106 of the physical quantity sensor device 1100.

The physical quantity sensor 1101 is a sensor element which generates an output signal corresponding to the physical quantity of a detected measuring medium. The Vcc voltage divider section 1103 divides a power supply voltage supplied via a Vcc terminal. The computing section 1104 calculates a corrected output value of the physical quantity sensor 1101 based on an output value of the physical quantity sensor 1101, an output value of the temperature sensor 1102, and the initial setting information written in the storage section 1105. The input/output section 1106 outputs the corrected output value of the physical quantity sensor 1101, the output value of the temperature sensor 1102, and an output value of the Vcc voltage divider section 1103 to the exterior.

The setting device 1110 is configured of a first acquisition section 1111, a second acquisition section 1112, a first calculation section 1113, a second calculation section 1114, and an input/output section 1115. The first acquisition section 1111 acquires a plurality of initial output values from the input/output section 1106 of the physical quantity sensor device 1100 via the input/output section 1115. The second acquisition section 1112 acquires a target output value of the physical quantity sensor 1101 preset so as to correspond to a plurality of initial output values of the physical quantity sensor 1101. The first and second calculation sections 1113 and 1114 calculate the first and second characteristic values respectively.

FIG. 10 is a block diagram showing one example of an overall configuration of a semiconductor physical quantity sensor device formed on a semiconductor chip by applying the invention of FIG. 9. A physical quantity sensor device 1200 is configured of a physical quantity sensor 1201, a temperature sensor 1202, a Vcc voltage divider section 1203, a computing circuit 1204, a data storage section 1205, an I/O (Input/Output) interface 1206, first to third sample holds 1211 to 1213, first and second selectors 1214 and 1219, an A/D converter 1215, and first to third latches 1216 to 1218.

The physical quantity sensor 1201, temperature sensor 1202, and Vcc voltage divider section 1203 correspond to the heretofore described physical quantity sensor 1101, temperature sensor 1102, and Vcc voltage divider section 1203 of FIG. 9. Respective output signals of the physical quantity sensor 1201, temperature sensor 1202, and Vcc voltage divider section 1203 are analog signals. The first to third sample holds 1211 to 1213, disposed in the stages subsequent to the physical quantity sensor 1201, temperature sensor 1202, and Vcc voltage divider section 1203 respectively, retrieve (sample) the respective analog signals, continuously input from the preceding stages, at regular time intervals, and hold the respective sampled analog signals for a fixed time.

The A/D converter 1215 is disposed in a stage following the first to third sample holds 1211 to 1213 via the first selector 1214. The first selector 1214 selects one of the analog signals input from the first to third sample holds 1211 to 1213 and outputs the one to the A/D converter 1215. The A/D converter 1215 converts the analog signal selected by the first selector 1214 to a digital signal, and outputs the digital signal to the computing circuit 1204. The computing circuit 1204 and data storage section 1205 correspond respectively to the heretofore described computing section 1104 and storage section 1105 of FIG. 9.

The first to third latches 1216 to 1218 hold the digital signals of the physical quantity sensor 1201, temperature sensor 1202, and Vcc voltage divider section 1203, respectively, for a fixed time. The second selector 1219 selects one of the digital signals input from the first to third latches 1216 to 1218, and outputs the one to the I/O interface 1206. The I/O interface 1206 corresponds to the heretofore described input/output section 1106 of FIG. 9 and carries out a digital signal input from the second selector 1219 and output to the exterior. Reference numerals 1221 to 1223 are a reference voltage source, a sensor drive circuit, and an oscillator respectively.

That is, the physical quantity sensor device of WO2013/100156 is of a digital output type which outputs a result of digital computation to the exterior with the result remaining as a digital signal. However, the market trend is such that a heretofore known analog output type which outputs an analog signal to the exterior is still a mainstream. The reasons include the facts that digital communication standards are not unified, the transmission rate of digital communication is lower than the transmission rate of analog communication, the rate of communication with a digital signal output to the exterior from the physical quantity sensor device (for example, the data transfer rate of an in-vehicle network (CAN: Controller Area Network or LIN: Local Interconnect Network)) is low, the digital output type is costly, and the like.

In order to solve the problems of the digital output type of physical quantity sensor device, various studies are also being made on a physical quantity sensor device in which are combined a digital computation for an improvement in correction accuracy and an analog output type with high market needs. As this kind of physical quantity sensor device, there is proposed a device wherein a flow signal analog-to-digital conversion circuit, an adjustment computing circuit, and a chip temperature sensor circuit are formed into an integrated circuit on one semiconductor chip, and a chip temperature signal output from the chip temperature sensor circuit is input into the adjustment computing circuit, thus carrying out a correction for reducing a signal processing-system temperature dependence error (for example, refer to JP-A-2003-166865).

JP-A-2003-166865 discloses a method whereby, in a flow sensor device which measures a gas flow, an output value of a flow sensor (sensor element) and an output value of a temperature sensor, disposed on the same chip as the flow sensor, are converted to respective digital signals by an A/D converter, and a corrected output value of the flow sensor is acquired using a digital computation based on information stored in a memory. The differences of the physical quantity sensor device of JP-A-2003-166865 from the physical quantity sensor device of WO2013/100156 are the following three.

The first difference is that a D/A converter (DAC: Digital-to-Analog converter) which converts a digital signal (a computation result) to an analog signal is provided between a digital computing circuit and an output terminal. The second difference is that the output terminal is for an analog output, and furthermore, that a digital I/O terminal is provided. The third difference is that items of information converted to digital signals by an A/D converter to be used for a digital computation are only an output signal of the flow sensor to be corrected and an output signal of the temperature sensor, and that no output signal of a Vcc voltage divider is in use.

Also, as a device which corrects a converted digital signal or analog signal, the following device is proposed. In an A/D conversion device, a correction value of a digital signal, to which an analog signal is converted, is obtained from the difference in value between a digital signal obtained using a least squares method and a pre-given ideal digital signal. Also, in a D/A conversion device, a correction value is obtained from the difference between the values of three or more digital signals, to which the respective values of different three or more input analog signals are converted, and the values of three or more digital signals to which are converted the exact values of three or more input analog signals corresponding to the respective values of the different three or more input analog signals (for example, refer to JP-A-10-145231).

However, not only the output value of the physical quantity sensor but also the output values of the peripheral circuits are included in the objects which should be corrected in the physical quantity sensor device. In particular, as the D/A converter is further provided in the analog output type of physical quantity sensor device, compared with in the digital output type of physical quantity sensor device, factors causing a variation in the output value of the physical quantity sensor increase. In JP-A-2003-166865 disclosing the analog output type of physical quantity sensor device, the respective characteristic variations of the physical quantity sensor, A/D converter, and D/A converter are converted into one computation expression and collectively corrected, but there are the following two problems.

The first problem is that the respective characteristic variations of the physical quantity sensor, A/D converter, and D/A converter cannot be individually grasped. Because of this, information which can be fed back to the process of manufacturing a physical quantity sensor or an IC (a physical quantity sensor device), on which is mounted the physical quantity sensor, is limited, thus causing a manufacturing management problem. Also, even though the physical quantity sensor shows an anomalous characteristic variation deviating from an error range, it is not possible to detect the characteristic variation of the physical quantity sensor when the characteristics of the A/D converter and D/A converter vary so as to cancel out the anomalous characteristic variation of the physical quantity sensor, thus causing a quality characteristic problem.

The second problem is that when the conversion accuracy of the A/D converter and D/A converter is low, it is not possible to improve the overall accuracy (output characteristic correction accuracy) of the physical quantity sensor device. Because of this, there is the possibility of the need for measures to enhance the overall conversion accuracy of the physical quantity sensor device, such as by using highly accurate A/D converter and D/A converter, increasing the resolution (bits) of the A/D converter and D/A converter, and increasing the order of a computation expression for correcting the output characteristic of the physical quantity sensor device. Because of this, there is the problem of leading to an increase in cost.

SUMMARY OF THE INVENTION

In order to solve the heretofore described problems raised by the heretofore known technologies, the invention has for its object to provide a physical quantity sensor device which can output an analog output signal wherein a characteristic variation is corrected with a high accuracy, and a method of adjusting the physical quantity sensor device.

In order to solve the problems and achieve the object of the invention, a physical quantity sensor device according to an aspect of the invention includes a physical quantity sensor, a first conversion section, a computing section, a second conversion section, and an analog input/output section, and has the following features. The physical quantity sensor outputs an electrical signal corresponding to a detected physical quantity. The first conversion section converts an output value of the physical quantity sensor to digital. The computing section carries out a digital computation for correcting the output value of the physical quantity sensor, converted to digital by the first conversion section, to a predetermined value. The second conversion section converts a result computed by the digital computation to analog. The analog input/output section outputs an output value of the second conversion section to the exterior. Further, the analog input/output section and the first conversion section are electrically connected together, and an initial output characteristic of the first conversion section is acquired by a predetermined analog signal input into the first conversion section from the analog input/output section being converted to digital by the first conversion section. Before the output value of the physical quantity sensor is converted to digital by the first conversion section, an output characteristic of the first conversion section is adjusted based on the initial output characteristic of the first conversion section.

Also, in order to solve the problems and achieve the object of the invention, a physical quantity sensor device according to an aspect of the invention includes a physical quantity sensor, a first conversion section, a computing section, and a second conversion section, and has the following features. The physical quantity sensor outputs an electrical signal corresponding to a detected physical quantity. The first conversion section converts an output value of the physical quantity sensor to digital. The computing section carries out a digital computation for correcting the output value of the physical quantity sensor, converted to digital by the first conversion section, to a predetermined value. The second conversion section converts a result computed by the digital computation to analog. Further, an initial output characteristic of the second conversion section is acquired by a predetermined digital signal input into the second conversion section from the exterior being converted to analog by the second conversion section. After an output characteristic of the second conversion section is adjusted based on the initial output characteristic of the second conversion section, the computed result converted to analog by the second conversion section is output to the exterior.

Also, the physical quantity sensor device according to the invention, in the aspect of the invention, further includes an acquisition section which acquires an initial output value of the physical quantity sensor. Further, the computing section carries out the digital computation based on the initial output value of the physical quantity sensor converted to digital by the first conversion section. Before the initial output value of the physical quantity sensor is converted to digital by the first conversion section, the output characteristic of the first conversion section is adjusted based on the initial output characteristic of the first conversion section.

Also, the physical quantity sensor device according to the invention is such that, in the aspect of the invention, the output characteristic of the first conversion section is adjusted based on the error between the initial output characteristic of the first conversion section and a target output characteristic of the first conversion section.

Also, the physical quantity sensor device according to the invention is such that, in the aspect of the invention, the analog input/output section and the first conversion section are electrically connected, in an input switchable condition, via a wire.

Also, in order to solve the problems and achieve the object of the invention, a physical quantity sensor device adjusting method according to an aspect of the invention is a method of adjusting a physical quantity sensor device including a physical quantity sensor which outputs an electrical signal corresponding to a detected physical quantity; a first conversion section which converts an output value of the physical quantity sensor to digital; a computing section which carries out a digital computation for correcting the output value of the physical quantity sensor, converted to digital by the first conversion section, to a predetermined value; a second conversion section which converts a result computed by the digital computation to analog; and an analog input/output section which outputs an output value of the second conversion section to the exterior, wherein the analog input/output section and the first conversion section are electrically connected together, and the method has the following features. Firstly, a first step is carried out in which an initial output characteristic of the first conversion section is acquired by a predetermined analog signal input into the first conversion section from the analog input/output section being converted to digital by the first conversion section. Next, a second step is carried out in which, before an output value of the physical quantity sensor is converted to digital by the first conversion section, an output characteristic of the first conversion section is adjusted based on the initial output characteristic of the first conversion section.

According to the physical quantity sensor device, and the method of adjusting the physical quantity sensor device, according to the invention, in the physical quantity sensor device which outputs the computed result, wherein the output value of the physical quantity sensor is corrected by the digital computation, to the exterior in analog form, it is possible to carry out the digital computation in a condition in which adjustment information of the first conversion section is reflected in the computed result, and it is possible to output the computed result to the exterior in analog form in a condition in which adjustment information of the second conversion section is reflected in the computed result. Because of this, the advantage of it being possible to provide a physical quantity sensor device which can output an analog output signal wherein a characteristic variation of a physical quantity sensor or a characteristic variation of a peripheral device is corrected with a high accuracy, is produced.

BRIEF DESCRIPTION OF THE DRAWINGS

FIG. 3 is a chart illustrating operation modes of the physical quantity sensor device according to the first embodiment.

DETAILED DESCRIPTION OF THE INVENTION

Figure 1:
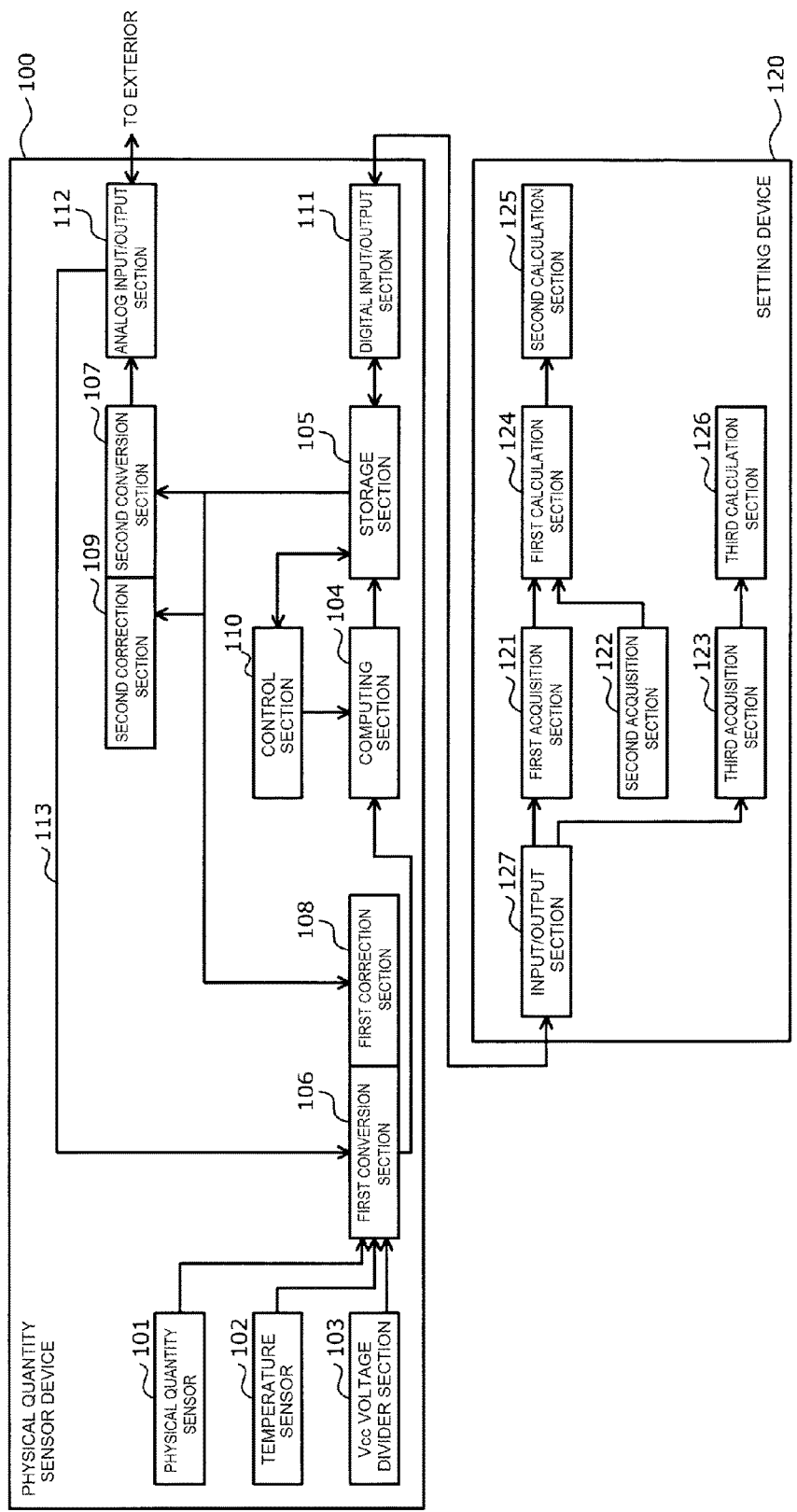
FIG. 1 is a block diagram showing a functional configuration of a physical quantity sensor device according to a first embodiment.

Hereafter, a detailed description will be given, referring to the accompanying drawings, of preferred embodiments of a physical quantity sensor device, and a method of adjusting the physical quantity sensor device, according to the invention. In the following description of the embodiments and the accompanying drawings, like components are given the same reference numerals and/or letters, thus omitting a redundant description.

First Embodiment

A description will be given of a functional configuration of a physical quantity sensor device according to a first embodiment. FIG. 1 is a block diagram showing a functional configuration of the physical quantity sensor device according to the first embodiment. A physical quantity sensor device 100 shown in FIG. 1 has the function of, after correcting an output signal of a physical quantity sensor 101 to a desired output value by a digital computation, converting a result of the computation to analog, and outputting the result to the exterior. The desired output value is, for example, an output value of the physical quantity sensor device 100, when in practical use or when under the test before shipment, based on an output characteristic preset based on the design specifications of the physical quantity sensor device 100. Specifically, the physical quantity sensor device 100 is configured of the physical quantity sensor 101, a temperature sensor 102, a Vcc voltage divider section 103, a computing section 104, a storage section 105, first and second conversion sections 106 and 107, first and second correction sections 108 and 109, a control section 110, a digital input/output section 111, and an analog input/output section 112.

The physical quantity sensor 101 is a sensor element which generates an output signal corresponding to the physical quantity of a detected measuring medium. A physical quantity detected by the physical quantity sensor 101 is a physical quantity, other than temperature, which depends on temperature. Specifically, the physical quantity sensor 101 is, for example, a pressure sensor, an acceleration sensor, a gyro (angle or angular velocity) sensor, or a flow sensor. The temperature sensor 102 is a sensor element which generates an output signal corresponding to the temperature of the detected measuring medium. The Vcc voltage divider section 103 divides a power supply voltage supplied to the physical quantity sensor device 100 via a Vcc terminal (not shown). Known sensor elements may be used as the physical quantity sensor 101 and temperature sensor 102.

Respective initial output values of the physical quantity sensor 101, temperature sensor 102, and Vcc voltage divider section 103 are used for a calculation of initial setting information by a setting device 120 to be described hereafter. The initial setting information is information for obtaining an initial (when adjusting an initial setting before shipment) output characteristic of the physical quantity sensor device 100, and includes at least a second characteristic value, of the following first and second characteristic values. The first characteristic value is information for correcting an output characteristic of the physical quantity sensor 101 which changes non-linearly relative to the detected physical quantity, and is a coefficient and constant term of a first characteristic expression showing a corrected output characteristic of the physical quantity sensor 101.

The second characteristic value is information for correcting the first characteristic value which changes non-linearly relative to a temperature detected by the temperature sensor 102, and is a coefficient and constant term of a second characteristic expression showing the temperature dependence of the first characteristic value. The first characteristic expression is a second- or higher-order polynomial with an output value of the physical quantity sensor 101 as a variable. The second characteristic expression is a second- or higher-order polynomial with an output value of the temperature sensor 102 as a variable. The initial setting information is calculated by first and second calculation sections 124 and 125 of the setting device 120, to be described hereafter, and stored in the storage section 105. Also, the respective output values (physical quantities detected when in practical use or under the test before shipment) of the physical quantity sensor 101, temperature sensor 102, and Vcc voltage divider section 103 are input into the computing section 104.

The computing section 104 carries out a computation based on the output value of the physical quantity sensor 101, the output value of the temperature sensor 102, and the initial setting information retrieved from the storage section 105, thus calculating a corrected output value of the physical quantity sensor 101. Specifically, the computing section 104 is configured of a computing circuit equivalent to one transfer function expression formed of the first and second characteristic expressions or a circuit for processing a computing program. Further, the computing section 104, by the output value of the temperature sensor 102 and the second characteristic value being input, calculates the corrected first characteristic value based on the second characteristic expression. Furthermore, the computing section 104, by the corrected first characteristic value and the output value of the physical quantity sensor 101 being input, computes the corrected output value of the physical quantity sensor 101 based on the first characteristic expression attaining a condition in which the coefficient and constant term (the first characteristic value) is corrected.

Also, the computing section 104, upon receiving an input of an output signal of the Vcc voltage divider section 103, may further calculate a corrected output value of the physical quantity sensor 101 increased or reduced by an amplification factor proportional to the power supply voltage supplied to the physical quantity sensor device 100. In this case, the computing section 104 only has to increase or reduce the corrected output value of the physical quantity sensor 101 by the amplification factor (=Vcc/Vcc0) of an output value Vcc of the Vcc voltage divider section 103 to a reference output value Vcc0 of the Vcc voltage divider section 103. Specifically, when the amplification factor of the output value Vcc of the Vcc voltage divider section 103 is +10%, the computing section 104 also amplifies the corrected output value of the physical quantity sensor 101 by +10%.

The storage section 105 stores at least the heretofore described initial setting information, input from the exterior via the digital input/output section 111, and respective items of adjustment information of the first and second conversion sections 106 and 107 to be described hereafter. The first conversion section 106 is, for example, an A/D converter which converts an analog signal to a digital signal. Specifically, the first conversion section 106, disposed in the stage subsequent to the physical quantity sensor 101, temperature sensor 102, Vcc voltage divider section 103, and analog input/output section 112, converts their respective analog output signals to digital and outputs the digital signals to the computing section 104 in the subsequent stage. The second conversion section 107 is, for example, a D/A converter which converts a digital signal to an analog signal. Specifically, the second conversion section 107, disposed in the stage subsequent to the storage section 105, converts an output signal of the digital input/output section 111, input via the storage section 105, or a digital value, retrieved from the storage section 105, to analog and outputs the analog signal or value to the analog input/output section 112 in the subsequent stage.

An initial output value of the first conversion section 106 is used to calculate the adjustment information for adjusting a conversion error of the first conversion section 106. The adjustment information of the first conversion section 106 is, for example, a correction value for correcting the error between an initial output characteristic of the first conversion section 106 and a target output characteristic of the first conversion section 106. An output characteristic of the first conversion section 106 is normally expressed by a transfer function showing a linearity based on a digital output (a digital output code plot) relative to an analog input. Consequently, specifically, the initial output value of the first conversion section 106 is used to calculate the initial output characteristic of the first conversion section 106 for obtaining the adjustment information of the first conversion section 106.

An initial output value of the second conversion section 107 is used to calculate the adjustment information for adjusting a conversion error of the second conversion section 107. Specifically, the adjustment information of the second conversion section 107 is, for example, a correction value for correcting the error between an initial output characteristic of the second conversion section 107 and a target output characteristic of the second conversion section 107. An output characteristic of the second conversion section 107 is normally expressed by a transfer function showing a linearity based on an analog output (an analog output plot) relative to a digital input. Consequently, specifically, the initial output value of the second conversion section 107 is used to calculate the initial output characteristic of the second conversion section 107 for obtaining the adjustment information of the second conversion section 107.

The respective items of adjustment information of the first and second conversion sections 106 and 107 are calculated by, for example, a third calculation section 126 of the setting device 120 to be described hereafter, and stored in the storage section 105. The first correction section 108, connected to the first conversion section 106, corrects the output characteristic of the first conversion section 106, based on the adjustment information of the first conversion section 106 retrieved from the storage section 105, before the process of converting the respective initial output values of the physical quantity sensor 101, temperature sensor 102, and Vcc voltage divider section 103 to digital is carried out by the first conversion section 106. Specifically, the first correction section 108 corrects a gain error, offset error, or linearity error of the first conversion section 106. The second correction section 109, connected to the second conversion section 107, corrects the output characteristic of the second conversion section 107, based on the adjustment information of the second conversion section 107 retrieved from the storage section 105, before the process of converting the respective initial output values of the physical quantity sensor 101, temperature sensor 102, and Vcc voltage divider section 103 to digital is carried out by the second conversion section 107. Specifically, the second correction section 109 corrects a gain error, offset error, or linearity error of the second conversion section 107.

The control section 110 selects one of operation modes of the physical quantity sensor device 100 and controls the operation of the physical quantity sensor device 100. Specifically, the control section 110 carries out an input/output switching of the digital input/output section 111 and analog input/output section 112, a switching to an input into the first conversion section 106, and the like. The switching to the input into the first conversion section 106 is to switch which one of the inputs of the output signals of the physical quantity sensor 101, temperature sensor 102, Vcc voltage divider section 103, and analog input/output section 112 is to be received by the first conversion section 106. The operation modes of the physical quantity sensor device 100 are broadly classified into an operation mode in which to correct the output value of the physical quantity sensor device 100 when the physical quantity sensor device 100 is in practical use and an operation mode in which to adjust the initial output characteristics of the physical quantity sensor 101, digital input/output section 111, and analog input/output section 112 when the physical quantity sensor device 100 is under adjustment before shipment. The details of the operation modes of the physical quantity sensor device 100 will be described hereafter.

The digital input/output section 111 can switch between an input in an input mode in which to receive a digital input from the exterior and an output in an output mode for a digital output to the exterior. When in the input mode, the digital input/output section 111 receives an input of initial setting information of the physical quantity sensor device 100 from the setting device 120. Also, the digital input/output section 111, when measuring the initial output value of the second conversion section 107, receives an input of a predetermined voltage. Meanwhile, when in the output mode, the digital input/output section 111 outputs the corrected output value of the physical quantity sensor 101, and the respective initial output values of the physical quantity sensor 101, temperature sensor 102, Vcc voltage divider section 103, and the initial output value of the first conversion section 106, to the exterior in digital form.

The analog input/output section 112 can switch between an input in an input mode in which to receive a digital input from the exterior and an output in an output mode for a digital output to the exterior. When in the input mode, the analog input/output section 112, when measuring the initial output value of the first conversion section 106, receives an input of a predetermined voltage. Meanwhile, when in the output mode, the analog input/output section 112 outputs the corrected output value of the physical quantity sensor 101, and the initial output value of the second conversion section 107 for calculating the adjustment information of the second conversion section 107, to the exterior in analog form. The analog input/output section 112 and the first conversion section 106 are electrically connected by a wire 113, and by the input switching of the analog input/output section 112 and first conversion section 106 being carried out by the control section 110, a voltage signal (an analog signal) input into the analog input/output section 112 is input into the first conversion section 106 via the wire 113.

The initial output value of the first conversion section 106, output from the digital input/output section 111 to the exterior, is information for calculating the adjustment information of the first conversion section 106. The initial output value of the first conversion section 106 can be obtained by the voltage signal (analog signal) input into the analog input/output section 112 being converted to a digital signal by the first conversion section 106 and the voltage value of the digital signal being measured by an unshown measuring unit externally connected to the digital input/output section 111. It is possible to grasp the conversion accuracy of the first conversion section 106 from the error between the thus obtained initial output value of the first conversion section 106 and the target output value of the first conversion section 106. Also, it is possible to grasp the initial output characteristic of the first conversion section 106, that is, the adjustment information of the first conversion section 106, by measuring a plurality of initial output values of the first conversion section 106.

The initial output value of the second conversion section 107, output from the analog input/output section 112 to the exterior, is information for calculating the adjustment information of the second conversion section 107. The initial output value of the second conversion section 107 can be obtained by a voltage signal (a digital signal) input into the digital input/output section 111 being converted to an analog signal by the second conversion section 107, and by the voltage value of the analog signal being measured by an unshown measuring unit externally connected to the analog input/output section 112. It is possible to grasp the conversion accuracy of the second conversion section 107 from the error between the thus obtained initial output value of the second conversion section 107 and the target output value of the second conversion section 107. Also, it is possible to grasp the initial output characteristic of the second conversion section 107 by measuring a plurality of initial output values of the second conversion section 107.

The setting device 120 is configured of first to third acquisition sections 121 to 123, first to third calculation sections 124 to 126, and an input/output section 127. The first acquisition section 121 acquires at least three or more initial output values, which are output by the physical quantity sensor 101 for every at least three or more predetermined temperatures, from the digital input/output section 111 of the physical quantity sensor device 100 via the input/output section 127. That is, the first acquisition section 121 acquires at least the total of nine or more initial output values of the physical quantity sensor 101. The first acquisition section 121 may acquire an output value of the Vcc voltage divider section 103.

The second acquisition section 122 acquires target output values of the physical quantity sensor 101 preset so as to correspond to a plurality of initial output values of the physical quantity sensor 101. That is, the second acquisition section 122 acquires at least the total of nine or more target output values of the physical quantity sensor 101. The predetermined temperatures and the target output values of the physical quantity sensor 101 may be pre-stored in an unshown storage section of the setting device 120, or the inputs thereof may be received by an unshown input unit.

The third acquisition section 123 acquires a plurality of initial output values of the first conversion section 106 and a plurality of target output values of the first conversion section 106 via the input/output section 127. The target output value of the first conversion section 106 is, for example, an output value falling on a straight line connecting a zero value and an output value on the full scale (FS) of the target output characteristic of the first conversion section 106. Also, the third acquisition section 123 acquires a plurality of initial output values of the second conversion section 107 and a plurality of target output values of the second conversion section 107. The target output value of the second conversion section 107 is, for example, an output value falling on a straight line connecting a zero value and an output value on the full scale of the target output characteristic of the second conversion section 107. The third acquisition section 123 may acquire the initial output values of the first and second conversion sections 106 and 107 stored in the storage section 105, via the digital input/output section 111 and the input/output section 127, or may acquire the initial output values of the first and second conversion sections 106 and 107 from the unshown measuring units when measuring the initial output values of the first and second conversion sections 106 and 107. Also, the target output values of the first and second conversion sections 106 and 107 may be pre-stored in the unshown storage section of the setting device 120, or the inputs thereof may be received by the unshown input unit.

The first calculation section 124, based on the initial output values and target output values of the physical quantity sensor 101 acquired by the first and second acquisition sections 121 and 122, calculates the first characteristic value for calculating the corrected output value of the physical quantity sensor 101. Specifically, the first calculation section 124 calculates the first characteristic expression by approximating the initial output value of the physical quantity sensor 101 and the target output value of the physical quantity sensor 101 to a second- or higher-order polynomial, for each predetermined temperature, using, for example, a least squares method. Further, the first calculation section 124 sets the coefficient and constant term of the first characteristic expression calculated for each predetermined temperature to be the first characteristic value.

More specifically, the first calculation section 124 calculates an X-order ($2 \leq X \leq n-1$, where $n \geq 3$) polynomial for every m predetermined temperatures when the initial output values of n predetermined physical quantities of the physical quantity sensor 101 are acquired for every m predetermined temperatures by the first acquisition section 121 (the number of measurement points of the output values of the physical quantity sensor is n and the number of measurement points of the output values of the temperature sensor is m), and calculates the following equation (1) based on the X-order polynomials. The following equation (1) is the first characteristic expression configured in the computing section 104.

In the following equation (1), Vd is an output value of the physical quantity sensor 101 after the initial setting of the physical quantity sensor device 100, and $\Delta T$ is a detection temperature (the output value of the temperature sensor 102) of the temperature sensor 102 after the initial setting (the same also applies to the following equation (2) and equation (3)). After the initial setting means after the initial setting information is written in the storage section 105, for example, when the physical quantity sensor device 100 is in practical use or under the test before shipment. The detection temperature $\Delta T$ is an output value of the temperature sensor 102 with a reference temperature $T0=25°$ C. as a reference. Further, the first calculation section 124 sets a coefficient and constant term $k_{ij}$ of the X-order polynomial calculated for every m predetermined temperatures, where $i=1, 2, \ldots, n$ and $j=X, X-1, \ldots, 1, 0$, to be the first characteristic value.

$$Vout_i(\Delta T, Vd) = K_{iX}(\Delta T) \times Vd^X + K_{iX-1}(\Delta T) \times Vd^{X-1} + \ldots + K_{i1}(\Delta T) \times Vd + K_{i0}(\Delta T)$$
$$(i=1, 2, \ldots, n) \quad (1)$$

The first calculation section 124 may further calculate the first characteristic expression based on the output value of the Vcc voltage divider section 103. In this case, the first calculation section 124 calculates the first characteristic expression shown in the following equation (2). In the equation (2), Vcc is the output value of the Vcc voltage divider section 103 after the initial setting of the physical quantity sensor device 100. In this case, the first characteristic value is $k_{ij} \times Vcc/Vcc0$, where i=1, 2, . . . , n and j=X, X-1, . . . , 1, 0.

$$Vout_i(\Delta T, Vd) = \{K_{iX}(\Delta T) \times Vd^X + K_{iX-1}(\Delta T) \times Vd^{X-1} + \ldots + K_{i1}(\Delta T) \times Vd + K_{i0}(\Delta T)\} \times Vcc/Vcc0$$
$$(i=1, 2, \ldots, n) \quad (2)$$

The second calculation section 125 calculates the second characteristic value for calculating an approximate expression $K_i(\Delta T)$ of the first characteristic value, where i=1, 2, . . . , n, based on the predetermined temperature and the first characteristic value. Specifically, the second calculation section 125 calculates the second characteristic expression shown in the following equation (3) by approximating the predetermined temperature and the first characteristic value $k_{ij}$ to a second- or higher-order polynomial, for each first characteristic value $k_{ij}$, using, for example, a least squares method. Further, the second calculation section 125 sets a coefficient and constant term $kT_{ij}$ of the second characteristic expression, where i=1, 2, . . . , n and j=Y(2≤Y≤m-1, where m≥3), Y-1, . . . , 0, to be the second characteristic value. The second characteristic value calculated by the second calculation section 125 is output to the digital input/output section 111 of the physical quantity sensor device 100 via the input/output section 127.

$$K_i(\Delta T) = kT_{iY} \times \Delta T^Y + kT_{iY-1} \times \Delta T^{Y-1} + \ldots + kT_{i1} \times \Delta T + kT_{i0}$$
$$(i=1, 2, \ldots, n) \quad (3)$$

The third calculation section 126 calculates the adjustment information of the first conversion section 106 based on the initial output value and target output value of the first conversion section 106 acquired by the third acquisition section 123. Specifically, the third calculation section 126, based on a plurality of initial output values of the first conversion section 106, calculates a transfer function (a proportional expression of an analog input and digital output) expressing the initial output characteristic of the first conversion section 106. Further, the third calculation section 126 compares a transfer function expressing the target output characteristic of the first conversion section 106 and the transfer function expressing the initial output characteristic of the first conversion section 106, and calculates the adjustment information of the first conversion section 106.

The third calculation section 126 calculates the adjustment information of the second conversion section 107 based on the initial output value and target output value of the second conversion section 107 acquired by the third acquisition section 123. Specifically, the third calculation section 126 calculates a transfer function expressing the initial output characteristic of the second conversion section 107 based on, for example, a plurality of initial output values of the second conversion section 107. Further, the third calculation section 126 compares a transfer function expressing the target output characteristic of the second conversion section 107 and the transfer function expressing the initial output characteristic of the second conversion section 107, and calculates the adjustment information of the second conversion section 107. Examples of the adjustment information of the first and second conversion sections 106 and 107 include a gain error (a rotational movement amount), an offset error (a parallel movement amount), and a linearity error (an output code step change amount). Because of this, for example, the rotational movement amount, parallel movement amount, and output code step change amount of the initial output characteristic relative to the target output characteristic may be calculated by the third calculation section 126.

Figure 2:
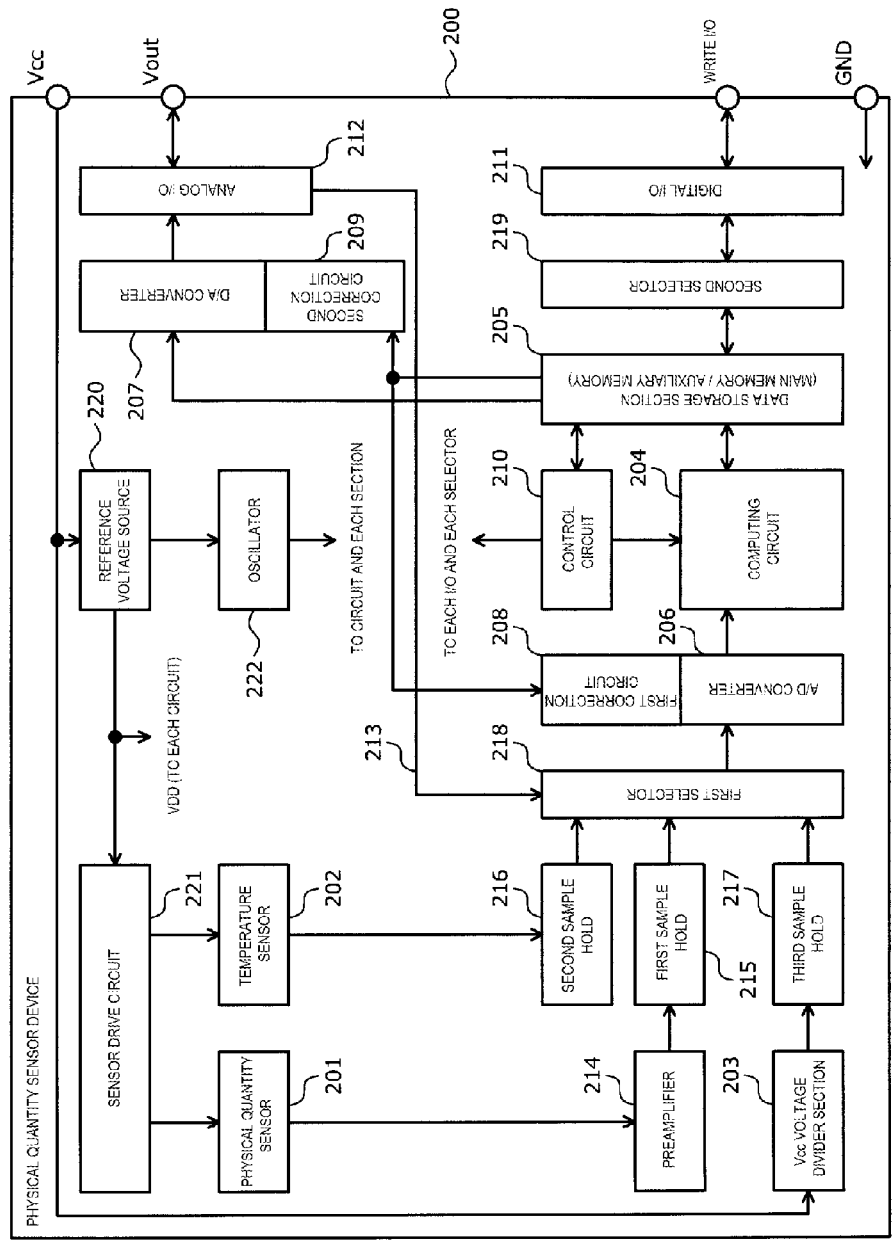
FIG. 2 is a block diagram showing an overall configuration of a semiconductor physical quantity sensor device formed on a semiconductor chip by applying the invention.

Next, a description will be given, referring to FIG. 2, of one example of an overall configuration of the physical quantity sensor device 100 shown in FIG. 1. FIG. 2 is a block diagram showing one example of an overall configuration of a semiconductor physical quantity sensor device formed on a semiconductor chip by applying the invention. A physical quantity sensor device 200 is configured of a physical quantity sensor 201, a temperature sensor 202, a Vcc voltage divider section 203, a computing section 204, a data storage section 205, an A/D converter 206, a D/A converter 207, first and second correction circuits 208 and 209, a control circuit 210, a digital I/O interface (hereafter referred to as a digital I/O) 211, an analog I/O interface (hereafter referred to as an analog I/O) 212, a preamplifier 214, first to third sample holds 215 to 217, first and second selectors 218 and 219, a reference voltage source 220, a sensor drive circuit 221, and an oscillator 222.

The physical quantity sensor 201, temperature sensor 202, and Vcc voltage divider section 203 correspond respectively to the heretofore described physical quantity sensor 101, temperature sensor 102, and Vcc voltage divider section 103 of FIG. 1. The computing circuit 204 and data storage section 205 correspond respectively to the heretofore described computing section 104 and storage section 105 of FIG. 1. The A/D converter 206, D/A converter 207, and first and second correction circuits 208 and 209 correspond respectively to the heretofore described first and second conversion sections 106 and 107 and first and second correction sections 108 and 109 of FIG. 1. The control circuit 210, digital I/O 211, and analog I/O 212 correspond respectively to the heretofore described control section 110, digital input/output section 111, and analog input/output section 112 of FIG. 1.

The respective output signals of the physical quantity sensor 201, temperature sensor 202, and Vcc voltage divider section 203 are analog signals. The first sample hold 215 is disposed in a stage following the physical quantity sensor 201 via the preamplifier 214. The preamplifier 214 has the function of amplifying the output signal of the physical quantity sensor 210. The second and third sample holds 216 and 217 are disposed in the stages subsequent to the temperature sensor 202 and Vcc voltage divider section 203 respectively. The A/D converter 206 is disposed in a stage following the first to third sample holds 215 to 217 via the first selector 218.

The first sample hold 215 retrieves (samples) analog signals, continuously input from the physical quantity sensor 201, at regular time intervals and holds the analog signals for a fixed time. The second sample hold 216 retrieves analog signals, continuously input from the temperature sensor 202, at regular time intervals and holds the analog signals for a fixed time. The third sample hold 217 retrieves analog signals, continuously input from the Vcc voltage divider section 203, at regular time intervals and holds the analog signals for a fixed time. The first selector 218 receives inputs from the first to third sample holds 215 to 217. The first selector 218, connected to the analog I/O 212 via a wire 213, receives an input from the analog I/O 212.

The first selector 218 selects one of the analog signals input from the first to third sample holds 215 to 217 and analog I/O 212, and outputs the one to the A/D converter 206. The A/D converter 206 converts the output signal (analog signal) of the physical quantity section 201, selected by the first selector 218, to digital, and outputs the digital signal to the computing circuit 204. Also, the A/D converter 206 converts the respective output signals (analog signals) of the temperature sensor 202, Vcc voltage divider section 203, and analog I/O 212, selected by the first selector 218, to digital, and outputs the digital signals to the computing circuit 204. The output signal of the analog I/O 212 is a voltage signal input into the analog I/O 212 from the exterior when the analog I/O 212 is in the output mode.

The computing circuit 204 retrieves initial setting information pre-stored in the data storage section 205 when the physical quantity sensor device 200 is in practical use, amplifies the digitized output signal (hereafter referred to as the digital signal) of the physical quantity sensor 201 by a predetermined amplification factor based on the initial setting information, and outputs the amplified digital signal. Also, the computing circuit 204 outputs the respective digitized output signals (digital signals) of the physical quantity sensor 201, temperature sensor 202, Vcc voltage divider section 203, and analog I/O 212, with the output signals remaining as the initial output values without carrying out any computation when the physical quantity sensor device 200 is under adjustment before shipment. The output signals (digital signals) of the computing circuit 204 are stored in the data storage section 205 in the subsequent stage.

The digital signals input into the data storage section 205, by a predetermined voltage being applied to the data storage section 205 from a write I/O terminal, are semipermanently stored in the data storage section 205. Digital signals input into the digital I/O 211 from the exterior are further stored in the data storage section 205. The digital signals input into the digital I/O 211 from the exterior are a voltage signal for measuring the initial output value of the D/A converter 207, values (the initial setting information, the adjustment information of the A/C converter 206, and the adjustment information of the D/A converter 207) calculated by the setting device 120, and the like.

The D/A converter 207, when the physical quantity sensor device 200 is in practical use, retrieves a result computed by the computing circuit 204 stored in the data storage section 205, coverts the result to analog, and outputs the result to the analog I/O 212 in analog form. Also, the D/A converter 207, when the physical quantity sensor device 200 is under adjustment before shipment, converts a voltage signal, input into the D/A converter 207 from, for example, a voltage source connected to the digital I/O 211 through the digital I/O 211 and data storage section 205, to analog, and outputs an initial output value of the D/A converter 207 to the analog I/O 212. The adjustment information of the A/D converter 206 is calculated using the initial output value of the D/A converter 207.

The first correction circuit 208, when the physical quantity sensor device 200 is under adjustment before shipment, retrieves the adjustment information of the A/D converter 206 stored in the data storage section 205 and corrects the output characteristic value of the A/D converter 206 before the respective initial output values of the physical quantity sensor 201, temperature sensor 202, and Vcc voltage divider section 203 are converted to digital by the A/D converter 206. Consequently, when the physical quantity sensor device 200 is under adjustment before shipment, the respective initial output values of the physical quantity sensor 201, temperature sensor 202, and Vcc voltage divider section 203 are output values in which the adjusted output characteristic of the A/D converter 206 is reflected. The first correction circuit 208 may be of, for example, a binary load type which carries out the weighting of resolution (bits) by, for example, electrically connecting or disconnecting a plurality of routes of redundant circuits prepared in advance, based on the adjustment information of the first correction circuit 208.

The second correction circuit 209, when the physical quantity sensor device 200 is under adjustment before shipment, retrieves the adjustment information of the D/A converter 207 stored in the data storage section 205 and corrects the output characteristic of the D/A converter 207 before a result of digital computation by the computing circuit 204 is converted to analog by the D/A converter 207. Consequently, when the physical quantity sensor device 200 is in practical use, the corrected output value of the physical quantity sensor 201 computed by the computing circuit 204 is an output value in which the adjusted output characteristic of the D/A converter 207 is reflected. The second correction circuit 209 may be of, for example, a binary load type which carries out the weighting of resolution by, for example, electrically connecting or disconnecting a plurality of routes of redundant circuits prepared in advance, based on the items of adjustment information of the second correction circuit 209.

The second selector 219, when the digital I/O 211 is in the output mode, retrieves respective digital values of the physical quantity sensor 201, temperature sensor 202, Vcc voltage divider section 203, and analog I/O 212, stored in the data storage section 205, and outputs the digital values to the digital I/O 211. Also, the second selector 219, when the digital I/O 211 is in the input mode, outputs the digital signals input into the digital I/O 211 to the data storage section 205. The control circuit 210 carries out the input switching of the first and second selectors 218 and 219, digital I/O 211, and analog I/O 212 based on, for example, an operation mode selected by a program control.

The digital I/O 211, when in the output mode, outputs the digital signals, input from the second selector 219, to the exterior from the write I/O terminal. Items of information output to the exterior from the write I/O terminal are the initial output values of the physical quantity sensor 201, temperature sensor 202, and Vcc voltage divider section 203 and the result of digital computation by the computing circuit 204. Meanwhile, the digital I/O 211 outputs digital signals, input from the exterior when in the input mode, to the second selector 219. The digital signals input into the digital I/O 211 from the exterior are voltage signals for obtaining a value calculated by the setting device 120 and the initial output value of the D/A converter 207.

The analog I/O 212, when in the output mode, outputs analog signals, output from the D/A converter 207, to the exterior from a Vout terminal. Items of information output to the exterior from the analog I/O 212 are a result of analog computation by the computing circuit 204 and the initial output value of the D/A converter 207. Meanwhile, the analog I/O 212 outputs an analog signal, input from the exterior when in the input mode, to the first selector 218 via the wire 213. The analog signal input into the analog I/O 212 from the exterior is a voltage signal for obtaining the initial output value of the A/C converter 206.

The reference voltage source 220, by levelling the noise of a power supply voltage supplied from a Vcc terminal, generates a reference voltage suitable for the drive of the sensor drive circuit 221, and supplies the reference voltage to the sensor drive circuit 221. Also, the reference voltage source 220 supplies a voltage VDD to the oscillator 222 and each circuit in the physical quantity sensor device 200. The sensor drive circuit 221 generates a voltage of a predetermined size for driving the physical quantity sensor 201 and temperature sensor 202, and supplies the voltage to the physical quantity sensor 201 and temperature sensor 202. The oscillator 222 generates a clock signal for driving the A/D converter 206, D/A converter 207, and computing circuit 204, and supplies the clock signal to the A/D converter 206, D/A converter 207, and computing circuit 204.

Next, a detailed description will be given of operation modes 1 to 6 of the physical quantity sensor device 200 controlled by the control circuit 210. FIG. 3 is a chart illustrating the operation modes of the physical quantity sensor device according to the first embodiment. The operation mode 1 is an operation mode in which to obtain the initial output characteristic of the physical quantity sensor 201 when the physical quantity sensor device 200 is under adjustment before shipment. When the operation mode 1 is selected by the control circuit 210, a control is performed such that the respective initial output values of the physical quantity sensor 201, temperature sensor 202, and Vcc voltage divider section 203 are converted to digital by the A/D converter 206 and output to the setting device 120 from the digital I/O 211.

Specifically, the operation in the operation mode 1 of the physical quantity sensor device 200 is as follows. Firstly, the respective output signals (analog signals) of the physical quantity sensor 201, temperature sensor 202, and Vcc voltage divider section 203 are held by the first to third sample holds 215 to 217, respectively, for a fixed time. Next, the respective output signals held by the first to third sample holds 215 to 217 are input into the A/D converter 206 and converted to digital by the first selector 218 in, for example, a preset selection order, and input into the computing circuit 204. The digital signals input into the computing circuit 204 are stored in the data storage section 205 as they are without carrying out any computation by the computing circuit 204. In this condition, by applying a predetermined voltage to the data storage section 205 from the write I/O terminal, the information stored in the data storage section 205 is transferred (written) to a non-volatile memory in the data storage section 205, and initial setting information is semipermanently held in the data storage section 205 (hereafter, "written" in the data storage section 205 will be referred to simply as "stored"). Further, the respective initial output values of the physical quantity sensor 201, temperature sensor 202, and Vcc voltage divider section 203 stored in the data storage section 205 are retrieved by the second selector 219, sequentially output to the digital I/O 211 in, for example, a preset selection order, and output to the exterior from the write I/O terminal. This ends the operation mode 1 of the physical quantity sensor device 200.

In this way, in the operation mode 1, the respective output values of the physical quantity sensor 201, temperature sensor 202, and Vcc voltage divider section 203 are output to the exterior, remaining as the initial output values without being corrected. The respective initial output values of the physical quantity sensor 201, temperature sensor 202, and Vcc voltage divider section 203 obtained in the operation mode 1 are input into the setting device 120. In the setting device 120, initial setting information of the physical quantity sensor device 200 for calculating the heretofore described equation (1) (or equation (2)) and equation (3) is calculated based on the initial output values. A predetermined temperature when the initial output value of the physical quantity sensor 201 is output to the exterior from the physical quantity sensor device 200 is confirmed by, for example, the initial output value of the temperature sensor 202.

The control circuit 210 selects the operation mode 1 after selecting the operation mode 5 (a mode in which to acquire the initial output value of the A/D converter 206) to be described hereafter. By so doing, it is possible to acquire the respective initial output values of the physical quantity sensor 201, temperature sensor 202, and Vcc voltage divider section 203 in which the adjustment information of the A/C converter 206 is reflected. Also, the control circuit 210 selects, for example, the operation mode 4 (a mode in which to carry out a data write in the data storage section 205) to be described hereafter, and stores the initial setting information of the physical quantity sensor device 200 in the data storage section 205, before selecting the operation mode 3 (a mode in which to compute the corrected output value of the physical quantity sensor 201 in digital form and output the corrected output value to the exterior in analog form), to be described hereafter, after having selected the operation mode 1 . By so doing, in the operation mode 3 , the corrected output value of the physical quantity sensor 201 can be computed by the computing circuit 204.

The operation mode 2 is an operation mode in which to output the corrected output value of the physical quantity sensor 201 to the exterior in digital form. When the operation mode 2 is selected by the control circuit 210, a control is performed such that the output value of the physical quantity sensor 201 is corrected by the computing circuit 204, and that a result of the computation is output in digital form to the exterior from the digital I/O 211. Specifically, the operation in the operation mode 2 of the physical quantity sensor device 200 is as follows. Firstly, in the same way as in the operation mode 1 , the respective analog signals of the physical quantity sensor 201, temperature sensor 202, and Vcc voltage divider section 203 are converted to digital and input into the computing circuit 204. Also, the initial setting information (the second characteristic value calculated by the second calculation section 125) stored in the data storage section 205 is retrieved and input into the computing circuit 204. By so doing, the output value Vd of the physical quantity sensor 201, the detection temperature $\Delta T$ of the temperature sensor 202, the output value Vcc of the Vcc voltage divider section 203, and the second characteristic value $kT_{ij}$, where i=1, 2, . . . , n and j=Y, Y−1, . . . , 0, are input into the heretofore described equation (1) (or equation (2)) and equation (3), thus computing the corrected output value of the physical quantity sensor 201. Next, a result of the computation by the computing circuit 204 (the corrected output value of the physical quantity sensor 201) is stored in the data storage section 205. Subsequently, the corrected output value of the physical quantity sensor 201 is retrieved from the data storage section 205 by the second selector 219, input into the digital I/O 211, and output in digital form to the exterior from the write I/O terminal. This ends the operation mode 2 of the physical quantity sensor device 200. In this way, in the invention, it is also possible to output the corrected output value of the physical quantity sensor 201 in digital form.

The operation mode 3 is an operation mode in which to output the corrected output value of the physical quantity sensor 201 to the exterior in analog form when the physical quantity sensor device 200 is in practical use or under the test before shipment. When the operation mode 3 is selected by the control circuit 210, a control is performed such that the output value of the physical quantity sensor 201 is corrected by the computing circuit 204, and that a result of the computation is converted to analog by the D/A converter 207 and output to the exterior from the analog I/O 212. Specifically, the operation in the operation mode 3 of the physical quantity sensor device 200 is as follows. Firstly, in the same way as in the operation mode 2, the respective digital signals of the physical quantity sensor 201, temperature sensor 202, and Vcc voltage divider section 203, and the initial setting information stored in the data storage section 205, are input into the computing circuit 204, thus computing the corrected output value of the physical quantity sensor 201, and a result of the computation is stored in the data storage section 205. Subsequently, the corrected output value of the physical quantity sensor 201 is retrieved from the data storage section 205, converted to analog by the D/A converter 207, and output in analog form to the exterior from the Vout terminal through the analog I/O 212. This ends the operation mode 3 of the physical quantity sensor device 200. The control circuit 210, after selecting the operation mode 5, selects the operation mode 6 (a mode in which to acquire the initial output value of the D/A converter 207) to be described hereafter and the operation mode 1, and subsequently, selects the operation mode 3. The control circuit 210 only has to select the operation mode 6 before selecting the operation mode 3, and the timing of selecting the operation mode 6 may be before selecting the operation mode 5 or after selecting the operation mode 1. By so doing, the physical quantity sensor device 200 can output the corrected output value of the physical quantity sensor 201 in which the respective items of adjustment information of the A/D converter 206 and D/A converter 207 are reflected.

The operation mode 4 is an operation mode in which to store (write) information, input from the exterior, in the data storage section 205. When the operation mode 4 is selected by the control circuit 210, a control is performed such that the information input into the digital I/O 211 from the exterior is stored in the data storage section 205. Specifically, the operation in the operation mode 4 of the physical quantity sensor device 200 is as follows. Firstly, the digital I/O 211 is switched to the input mode by the control circuit 210, and an input signal from the exterior is input into the digital I/O 211 via the write I/O terminal. The input signal from the exterior is a voltage signal for measuring the initial setting information (the information to be calculated by the second calculation section 125) of the physical quantity sensor device 200 and the initial output value of the D/A converter 207. The information input into the digital I/O 211 is stored in the data storage section 205 via the second selector 219. This ends the operation mode 4 of the physical quantity sensor device 200.

Figure 4:
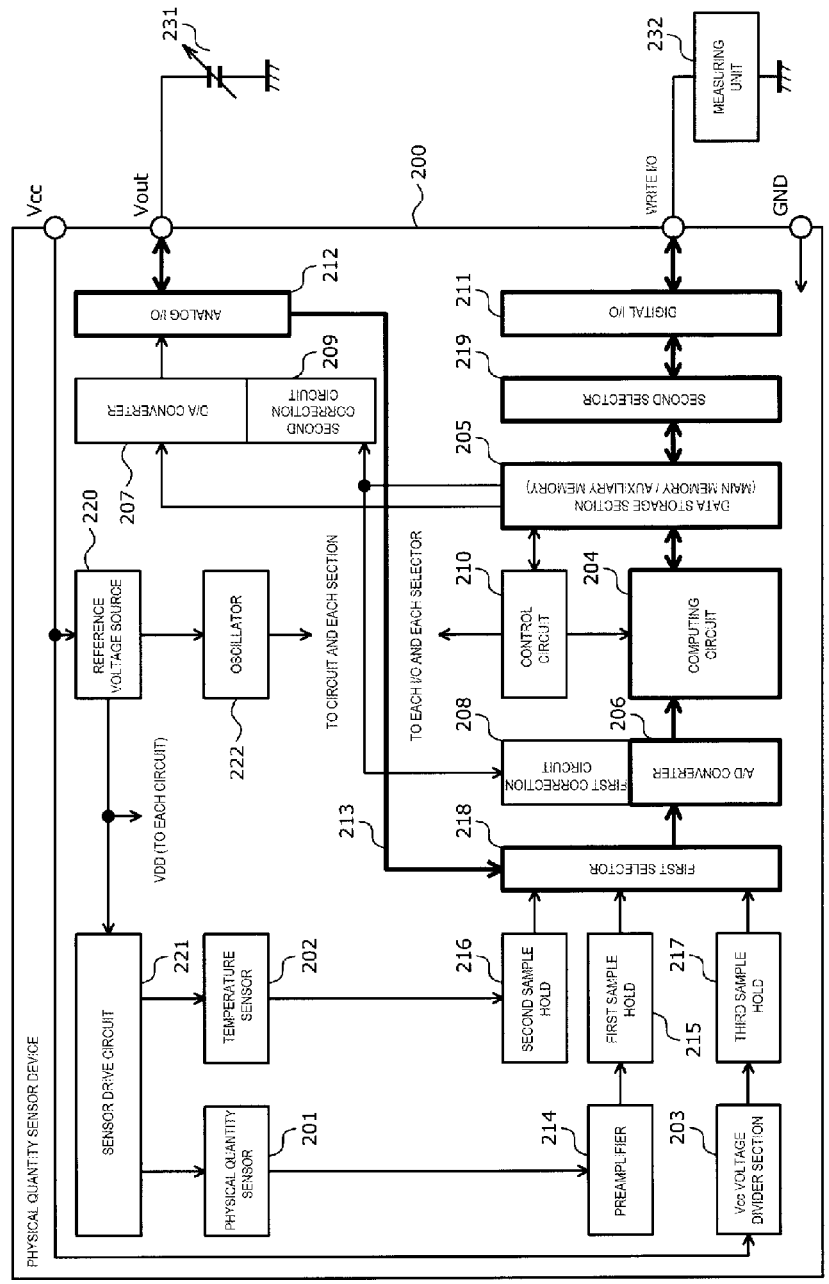
FIG. 4 is an illustration showing a signal path in an operation mode 5 of the physical quantity sensor device according to the first embodiment.

The operation mode 5 is an operation mode in which to acquire the initial output value of the A/D converter 206. FIG. 4 is an illustration showing a signal path in the operation mode 5 of the physical quantity sensor device 200 according to the first embodiment. In FIG. 4, a signaling pathway in the operation mode 5 is shown by the heavy line. When the operation mode 5 is selected by the control circuit 210, a control is performed such that the voltage signal input from the analog I/O 212 in the input mode is converted to digital by the A/D converter 206 and output to an external measuring unit 232 from the digital I/O 211 in the output mode. Specifically, the operation in the operation mode 5 of the physical quantity sensor device 200 is as follows. Firstly, as shown in FIG. 4, the analog I/O 212 is switched to the input mode, and the digital I/O 211 is switched to the output mode, by the control circuit 210. Also, a switching is performed by the control circuit 210 so that an analog signal from the analog I/O 212 is input into the A/D converter 206 via the wire 213. Further, an analog signal of a predetermined voltage is input into the analog I/O 212 from a voltage source 231 externally connected to the Vout terminal. As the analog I/O 212 and the A/D converter 206 are electrically connected by the control circuit 210, the analog signal of the predetermined voltage input from the analog I/O 212 is input into the A/D converter 206 in the following stage via the wire 213 and converted to digital. The signal converted to digital by the A/D converter 206 (the output signal of the A/D converter 206) is input into the digital I/O 211 through the computing circuit 204, data storage section 205, and second selector 219, and output in digital form to the measuring unit 232 from the write I/O terminal. At this time, as the output signal of the physical quantity sensor 201 is not input into the computing circuit 204, no computation is carried out. By so doing, as a result of measurement by the measuring unit 232, the initial output value of the A/D converter 206 is obtained, thus ending the operation mode 5 of the physical quantity sensor device 200.

The initial output value of the A/D converter 206 obtained in the operation mode 5 is input into the setting device 120, and the adjustment information of the A/D converter 206 is calculated by the setting device 120. The physical quantity sensor device 200 causes the control circuit 210 to select, for example, the operation mode 4 before selecting the operation mode 1 and store the adjustment information of the A/D converter 206 in the data storage section 205. That is, the operation mode 5, the operation mode 4, and the operation mode 1 are selected, in the order named, by the control circuit 210. The reason is that it is possible to obtain the respective initial output values of the physical quantity sensor 201, temperature sensor 202, and Vcc voltage divider section 203 in which the adjustment information of the A/D converter 206 is reflected, as heretofore described.

Figure 5:
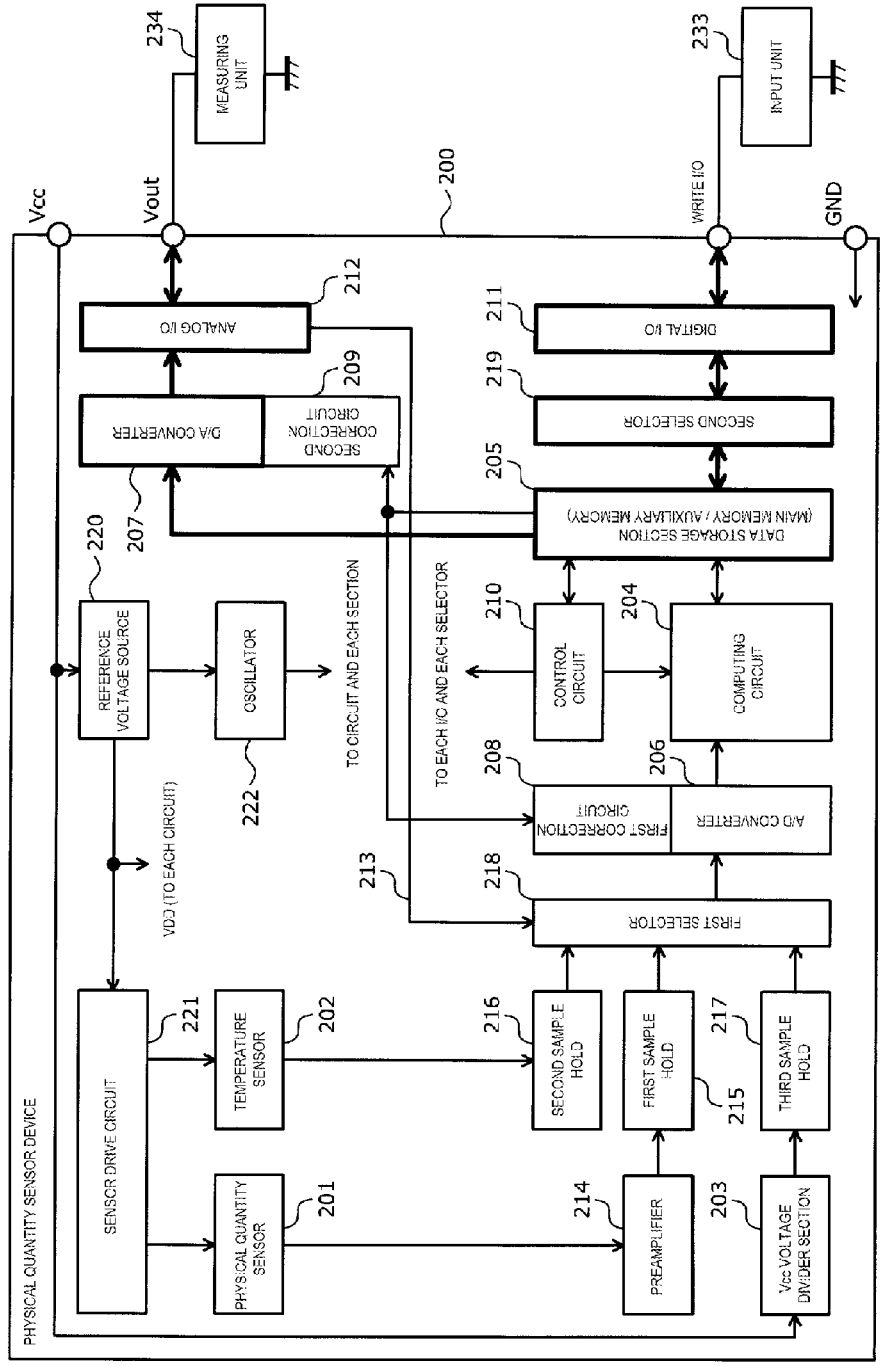
FIG. 5 is an illustration showing a signal path in an operation mode 6 of the physical quantity sensor device according to the first embodiment.

The operation mode 6 is an operation mode in which to acquire the initial output value of the D/A converter 207. FIG. 5 is an illustration showing a signal path in the operation mode 6 of the physical quantity sensor device 200 according to the first embodiment. In FIG. 5, a signaling pathway in the operation mode 6 is shown by the heavy line. When the operation mode 6 is selected by the control circuit 210, a control is performed such that a voltage signal input from the digital I/O 211 in the input mode is converted to analog by the D/A converter 207 and output to an external measuring unit 234 from the analog I/O 212 in the output mode. Specifically, the operation in the operation mode 6 of the physical quantity sensor device 200 is as follows. Firstly, as shown in FIG. 5, the digital I/O 211 is switched to the input mode, and the analog I/O 212 is switched to the output mode, by the control circuit 210. Also, a switching is performed by the control circuit 210 so that a digital signal from the digital I/O 211 is input into the D/A converter 207 via the data storage section 205. Further, a digital signal of a predetermined voltage is input into the digital I/O 211 from an input unit 233 externally connected to the write I/O terminal. As a switching is performed by the control circuit 210 so that a signal is transferred in a direction toward the D/A converter 207 from the data storage section 205, the digital signal of the predetermined voltage input from the digital I/O 211, passing through the data storage section 205, is input into the D/A converter 207 in the stage subsequent to the data storage section 205 and converted to analog. The signal converted to analog by the D/A converter 207 (the output signal of the D/A converter 207) is input into the analog I/O 212 and output in analog form to the measuring unit 234 from the Vout terminal. By so doing, as a result of measurement by the measuring unit 234, the initial output value of the D/A converter 207 is obtained, thus ending the operation mode 6 of the physical quantity sensor device 200.

The initial output value of the D/A converter 207 obtained in the operation mode 6 is input into the setting device 120, and the adjustment information of the A/D converter 206 is calculated by the setting device 120. The physical quantity sensor device 200 causes the control circuit 210 to select, for example, the operation mode 4 before selecting the operation mode 3 and store the adjustment information of the D/A converter 207 in the data storage section 205. Also, the physical quantity sensor device 200 causes the control circuit 210 to select the operation mode 1 before selecting the operation mode 3 and select the operation mode 5 before selecting the operation mode 1, as heretofore described. That is, it is preferable that the operation mode 5, the operation mode 6, the operation mode 1, the operation mode 4, and the operation mode 3 are selected, in the order named, by the control circuit 210 (the order of the operation modes 1 and 6 can be reversed). The reason is that it is possible to obtain the corrected output value of the physical quantity sensor 201 in which the respective items of adjustment information of the A/D converter 206 and D/A converter 207 are reflected, as heretofore described. The operation mode 4 may be selected each time the operation mode 5, the operation mode 6, or the operation mode 1 is selected by the control circuit 210.

Figure 6A:
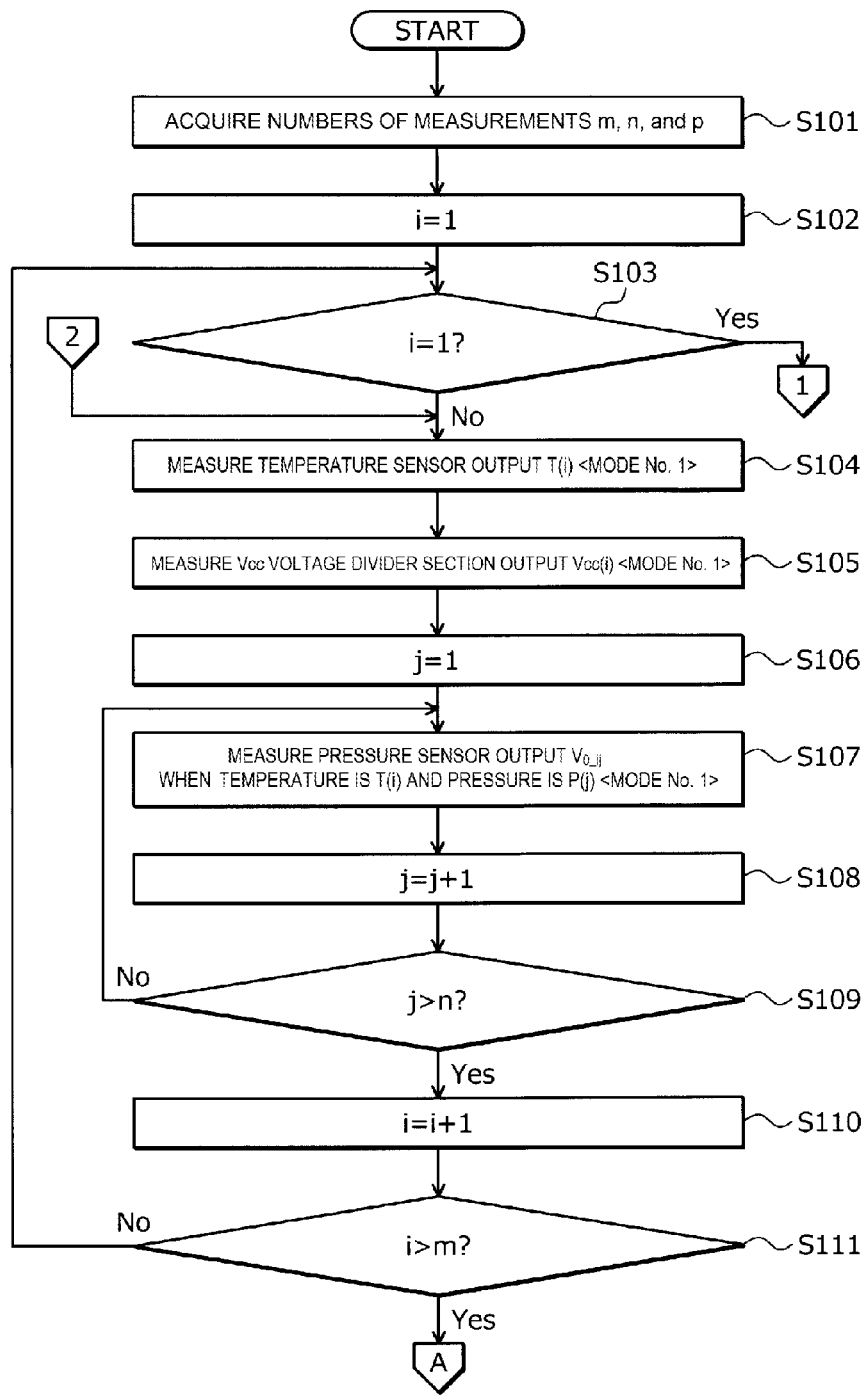
FIG. 6A is a flow chart showing a procedure of output value correction of the physical quantity sensor device according to the first embodiment (1).
Figure 6B:
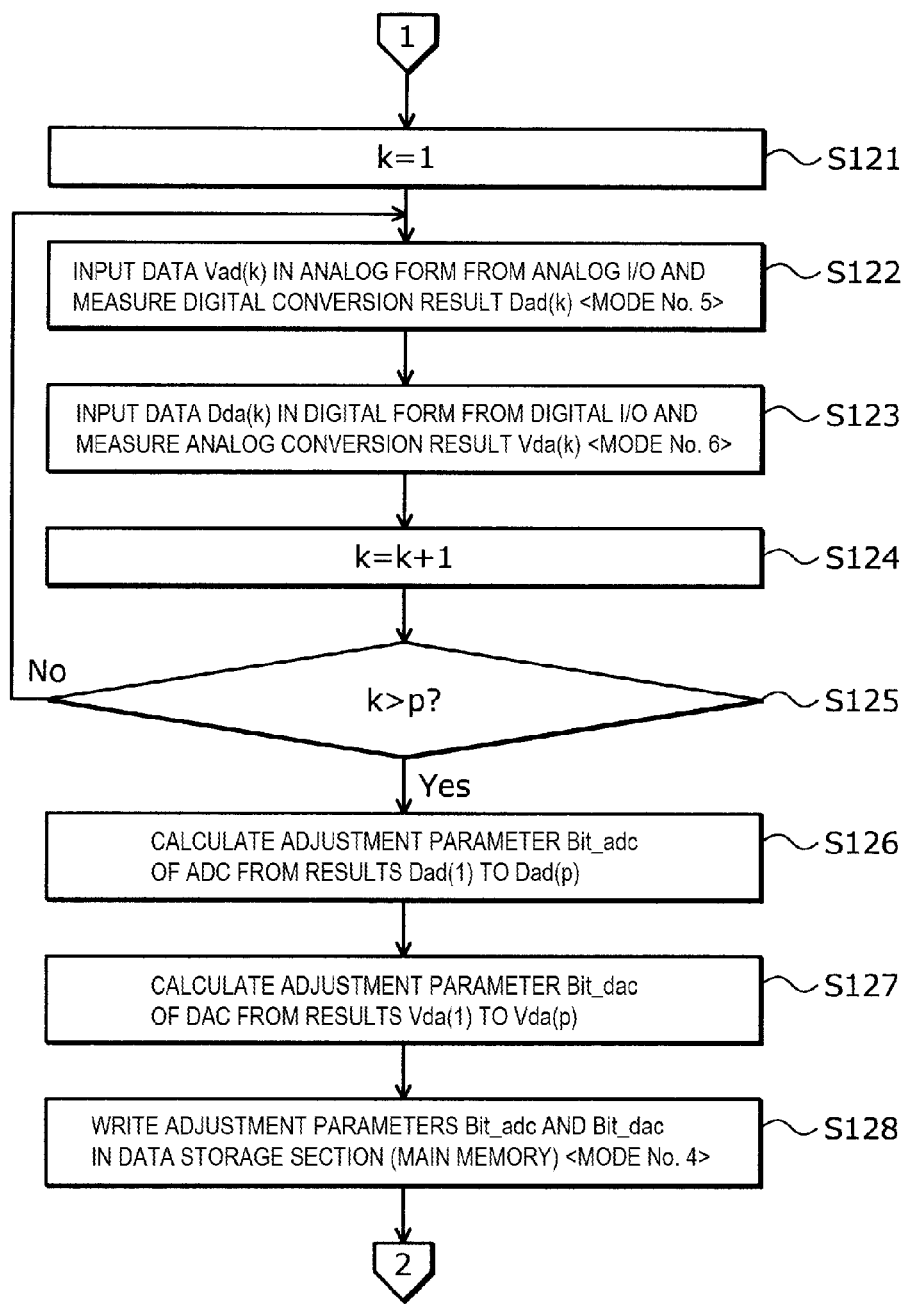
FIG. 6B is a flow chart showing the procedure of output value correction of the physical quantity sensor device according to the first embodiment (2).
Figure 6C:
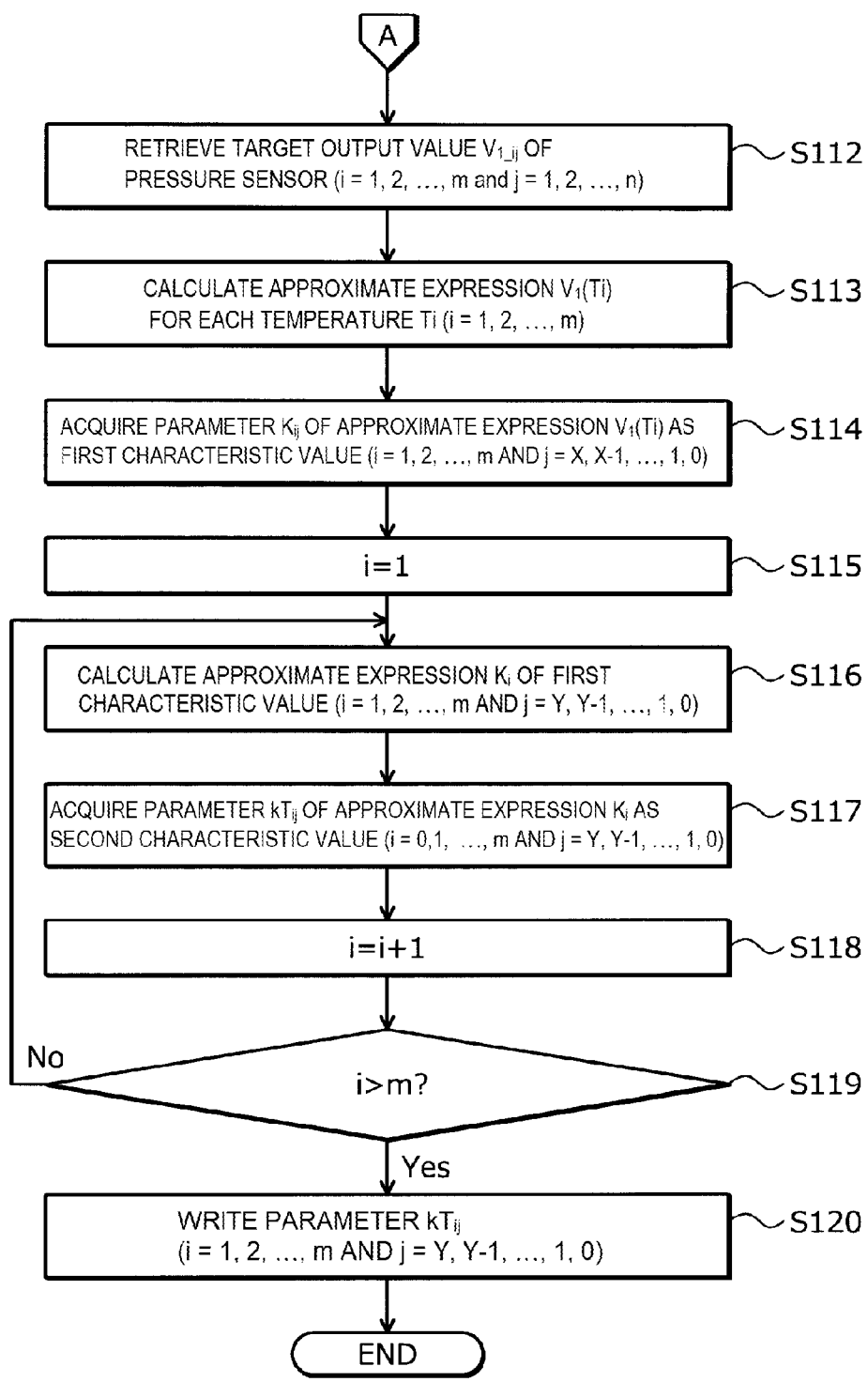
FIG. 6C is a flow chart showing the procedure of output value correction of the physical quantity sensor device according to the first embodiment (3).

Next, a description will be given, taking as an example a case in which the physical quantity sensor 201 is a pressure sensor (hereafter referred to as a pressure sensor 201), of a procedure of output value correction of the physical quantity sensor device 200 according to the first embodiment. FIGS. 6A to 6C are flow charts showing a procedure of output value correction of the physical quantity sensor device according to the first embodiment. FIGS. 6A to 6C show steps of calculating the adjustment information of the A/D converter 206 and D/A converter 207 and the initial setting conditions of the physical quantity sensor device 200. Firstly, as shown in FIG. 6A, a number of measurements n (≥3) of the output value of the pressure sensor 201, a number of measurements m (≥3) of the output value of the temperature sensor 202, and a number of measurements p (≥2) of the output values of the A/D converter 206 and D/A converter 207 are acquired (step S101). Next, 1 is assigned to a variable i (step S102).

Next, when the variable i is 1 (step S103: Yes), 1 is assigned to a variable k (step S121). Next, the operation mode 5 is selected by the control circuit 210, and as heretofore described, analog data Vad(k) are input from the analog I/O 212, and a digital conversion result Dad(k) of the A/D converter 206 is measured (step S122). Next, the operation mode 6 is selected by the control circuit 210, digital data Dda(k) are input from the digital I/O 211, and an analog conversion result Vda(k) of the D/A converter 207 is measured (step S123). Further, the variable k is incremented (step S124), and the steps S122 to S124 are repeatedly carried out until the variable k is greater than the number of measurements p (step S125: No). The steps so far are in the operation modes 5 and 6 of the physical quantity sensor device 200. The steps S123 and S122 may be carried out in the order named.

When the variable k is greater than the number of measurements p (step S125: Yes), an adjustment parameter (adjustment information) Bit_adc of the A/D converter 206 is calculated based on the digital conversion result Dad(k) of the A/D converter 206, where k=1, ..., p (step S126). Next, an adjustment parameter (adjustment information) Bit_dac of the D/A converter 207 is calculated based on the analog conversion result Vda(k) of the D/A converter 207, where k=1, ..., p (step S127). Next, the operation mode 4 is selected by the control circuit 210, and the adjustment parameter Bit_adc of the A/D converter 206 and the adjustment parameter Bit_dac of the D/A converter 207 are stored in the data storage section 205 (step S128).

The A/D converter 206 and the D/A converter 207 are adjusted based on the adjustment parameter Bit_adc of the A/D converter 206 and the adjustment parameter Bit_dac of the D/A converter 207. Because of this, it is possible to measure an initial output value $V_{0\_ij}$, to be described hereafter, in a condition in which the adjustment parameter Bit_adc of the A/D converter 206 and the adjustment parameter Bit_dac of the D/A converter 207 are reflected in subsequent steps S104 to S111.

Next, the operation mode 1 is selected by the control circuit 210, and a temperature T(i) detected by the temperature sensor 202 (that is, the detection temperature ΔT with the reference temperature T0 as a reference) and an output value Vcc(i) of the Vcc voltage divider section 203 when at the temperature T(i), are measured (steps S104 and S105). Next, after 1 is assigned to a variable j (step S106), the initial output value $V_{0\_ij}$ of the pressure sensor 201 when at the temperature T(i) and at a pressure P(j) is measured (step S107). Next, the variable j is incremented (step S108), and the steps S107 and S108 are repeatedly carried out until the variable j is greater than the number of measurements n (step S109: No).

When the variable j is greater than the number of measurements n (step S109: Yes), the variable i is incremented (step S110), and the steps S103 to S110 are repeatedly carried out until the variable i is greater than the number of measurements m (step S111: No). By so doing, n pressures are measured for every m temperatures, and the total of m×n or more initial output values $V_{0\_ij}$, where i=1, 2, ..., m and j=1, 2, ..., n, are measured and output to the exterior of the physical quantity sensor device 200. The steps so far are in the operation mode 1 of the physical quantity sensor device 200. A plurality of initial output values $V_{0\_ij}$ measured in the steps so far are acquired by the first acquisition section 121 of the setting device 120.

Next, when the variable i is greater than the number of measurements m (step S111: Yes), a target output value $V_{1\_ij}$ where i=1, 2, ..., m and j=1, 2, ..., n, of the pressure sensor 201 corresponding to the initial output value $V_{0\_ij}$ is retrieved by the second acquisition section 122 of the setting device 120 (step S112). Next, an approximate expression $V_1(Ti)$ of the target output value is calculated, for each temperature Ti, based on the initial output value $V_{0\_ij}$ and target output value $V_{1\_ij}$ (step S113). Next, a coefficient and constant term $K_{ij}$, where i=1, 2, ..., m and j=X, X−1, ..., 1, 0, of the approximate expression $V_1(Ti)$ of the target output value is acquired as the first characteristic value (step S114).

Next, 1 is assigned to the variable i (step S115), and as shown in the heretofore described equation (1), the approximate expression $K_i$ of the first characteristic value is calculated (step S116). Next, each parameter $kT_{ij}$, where i=0, 1, m and j=Y, Y−1, ..., 1, 0 (2≤Y≤n−1:n≥3), of the approximate expression of the first characteristic value is acquired as the second characteristic value (step S117). Further, the variable i is incremented (step S118), and the steps S116 to S118 are repeatedly carried out until the variable i is greater than the number of measurements m (step S119: No).

Next, when the variable i is greater than the number of measurements m (step S119: Yes), the coefficient and constant term (second characteristic value) $kT_{ij}$ of the approximate expression $K_i$ is written in the data storage section 205 of the physical quantity sensor device 200 as a correction parameter (initial setting information) (step S120). The step S120 is in the operation mode 4 of the physical quantity sensor device 200. Subsequently, the steps in the flow charts are finished. Henceforth, the operation mode 3 is selected by the control circuit 210, and by causing the physical quantity sensor device 200 to operate in the operation mode 3, the corrected output value of the pressure sensor 201, in which the respective items of adjustment information of the A/D converter 206 and D/A converter 207 are reflected, can be output in analog form from the analog I/O 212.

As heretofore described, according to the first embodiment, as it is possible to adjust the A/D converter based on the adjustment information of the A/D converter before measuring the respective initial output values of the physical quantity sensor, temperature sensor, and Vcc voltage divider section used in the digital computation for correcting the output value of the physical quantity sensor, it is possible to measure the respective initial output values of the physical quantity sensor, temperature sensor, and Vcc voltage divider section with the adjustment information of the A/D converter reflected in the initial output values, and it is possible to carry out the digital computation based on the initial output values, meaning that it is possible to correct the output value of the physical quantity sensor with a high accuracy. Also, even when converting the corrected output value of the physical quantity sensor, calculated by the digital computation, to analog and outputting the analog value to the exterior, it is possible to output the corrected output value of the physical quantity sensor, in analog form, with the adjustment information of the D/A converter reflected in the corrected output value. Consequently, it is possible to provide the physical quantity sensor device 200 which can output an analog output signal wherein a characteristic variation of the physical quantity sensor or a characteristic variation of a peripheral device is corrected with a high accuracy.

Also, according to the first embodiment, it is possible, after the physical quantity sensor device is completed, to adjust the A/D converter and D/A converter, with the first and second correction circuits, based on the respective items of adjustment information of the A/D converter and D/A converter. Because of this, even when the output characteristic of the physical quantity sensor device changes due to, for example, a pressure applied when packaging the physical quantity sensor device, it is possible, with a change in the output characteristic generated when packaging also taken into account, to correct the output characteristics of the physical quantity sensor device, A/D converter, and D/A converter after packaging. Also, according to the first embodiment, as it is possible to correct the respective output characteristics of the A/D converter and D/A converter, it is possible to accurately correct the output value of the physical quantity sensor without improving the overall conversion accuracy of the A/D converter and D/A converter such as by increasing the resolution (bits) of the A/D converter and D/A converter. Because of this, it is possible to reduce cost.

Second Embodiment

Figure 7:
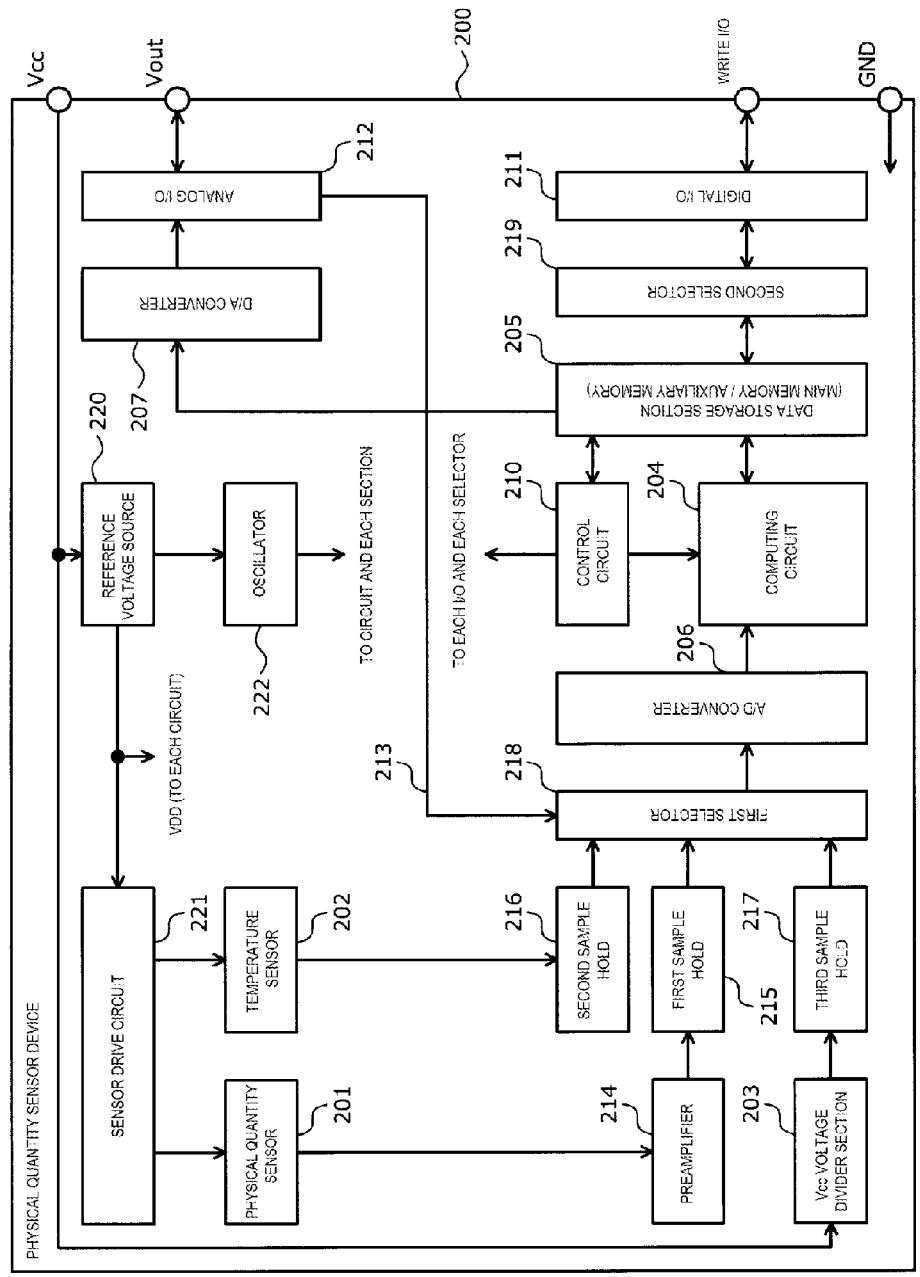
FIG. 7 is a block diagram showing one example of an overall configuration of a semiconductor physical quantity sensor device according to a second embodiment.

Next, a description will be given of a physical quantity sensor device according to a second embodiment. FIG. 7 is a block diagram showing one example of an overall configuration of a semiconductor physical quantity sensor device according to the second embodiment. FIG. 7 shows one example of the overall configuration of the semiconductor physical quantity sensor device formed on a semiconductor chip by applying the invention. The difference of the physical quantity sensor device according to the second embodiment from the physical quantity sensor device according to the first embodiment is that the first and second correction circuits are not provided. In the same way as in the first embodiment, the respective initial output values of the A/D converter 206 and D/A converter 207 are measured in the operation modes 5 and 6. Further, the determination of whether or not the A/D converter 206 or the D/A converter 207 is defective is carried out based on the error (adjustment information) between the initial output characteristic and the target output characteristic.

Figure 8:
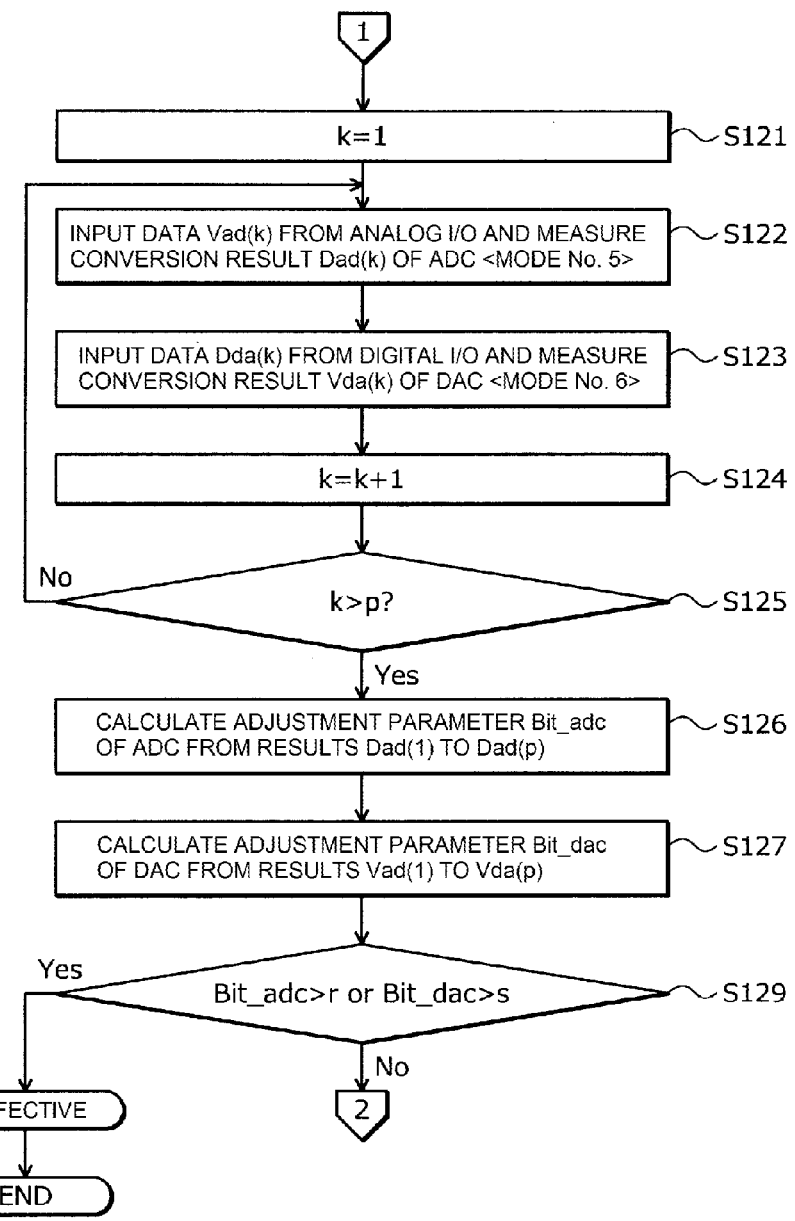
FIG. 8 is a flow chart showing a procedure of output value correction of the physical quantity sensor device according to the second embodiment.
Figure 9:
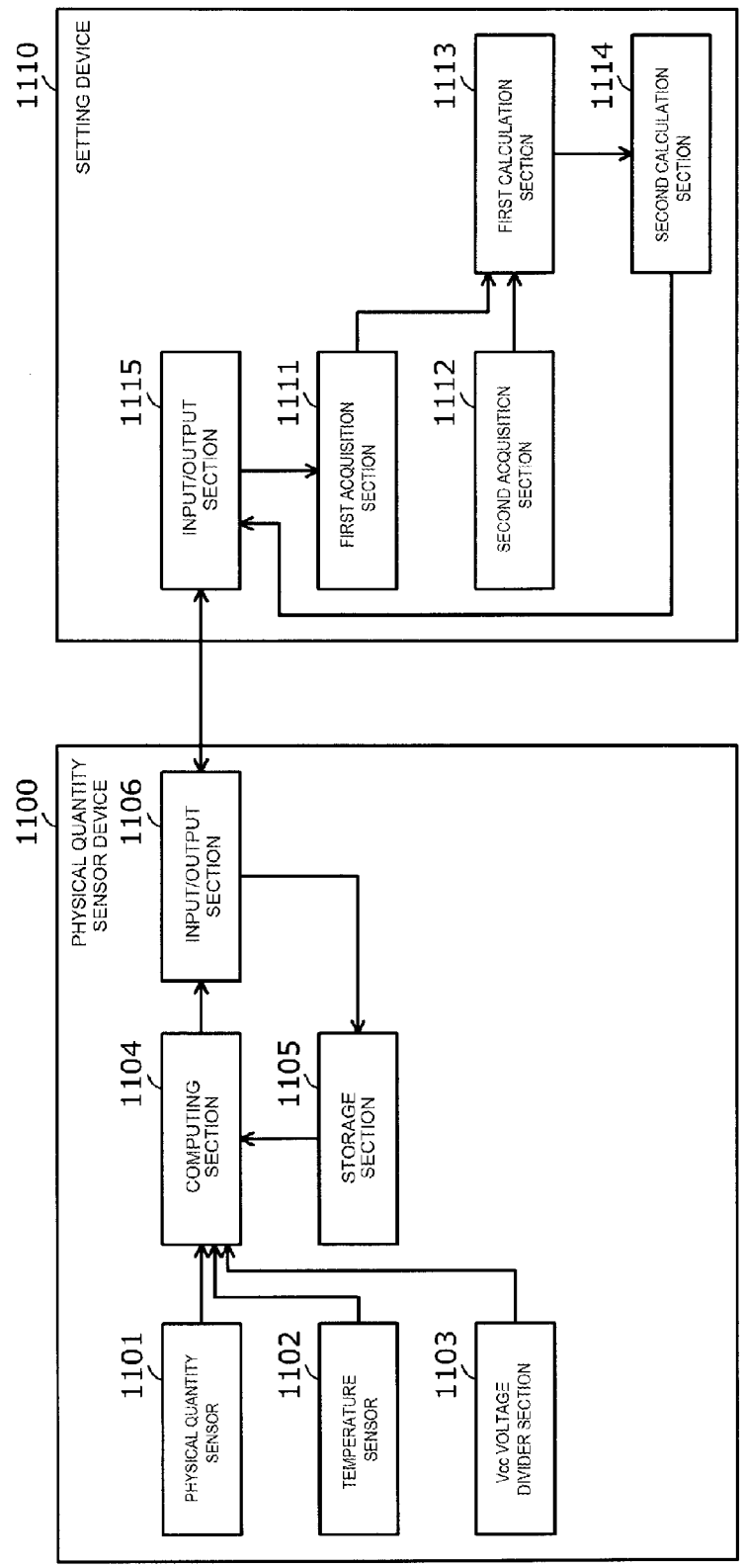
FIG. 9 is a block diagram showing a functional configuration of a heretofore known physical quantity sensor device.
Figure 10:
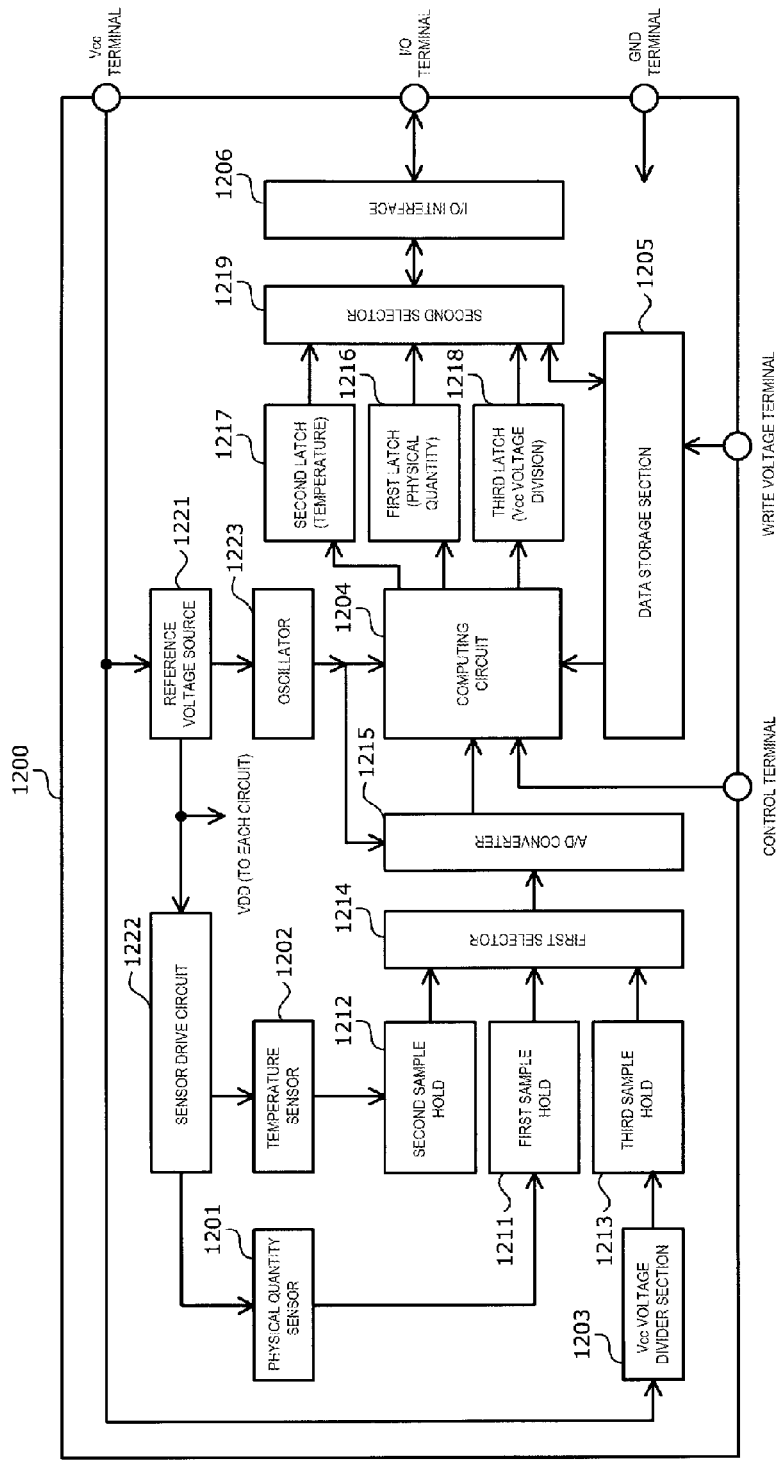
FIG. 10 is a block diagram showing one example of an overall configuration of a semiconductor physical quantity sensor device formed on a semiconductor chip by applying the invention of FIG. 9.

Next, a description will be given of a procedure of output value correction of the physical quantity sensor device according to the second embodiment. FIG. 8 is a flow chart showing the procedure of output value correction of the physical quantity sensor device according to the second embodiment. Firstly, in the same way as in the first embodiment, as shown in FIG. 6A, the numbers of measurements n, m, and p are acquired (step S101), and after assigning 1 to the variable i (step S102), steps from assigning 1 to the variable k (step S121) until the adjustment parameter (adjustment information) Bit_adc of the A/D converter 206 and the adjustment parameter (adjustment information) Bit_dac of the D/A converter 207 are calculated (steps S126 and S127), are carried out.

Next, as shown in FIG. 8, when the adjustment parameter Bit_adc of the A/D converter 206 is greater than a preset predetermined value r, or when the adjustment parameter Bit_dac of the D/A converter 207 is greater than a preset predetermined value s (step S129: Yes), it is determined that the A/D converter 206 or D/A converter 207 in this condition is defective, thus finishing the steps in the flow chart. Subsequently, the semiconductor chip whose A/D converter or D/A converter has been determined to be defective may, for example, be discarded.

Meanwhile, when the adjustment parameter Bit_adc of the A/D converter 206 is equal to or less than the preset predetermined value r, and when the adjustment parameter Bit_dac of the D/A converter 207 is equal to or less than the preset predetermined value s (step S129: No), the procedure is moved to the step S104 in the same way as in the first embodiment, and the subsequent steps up to the step S120 are carried out in the same way as in the first embodiment, thus finishing the steps in the flow chart, as shown in FIGS. 6A and 6C.

As heretofore described, according to the second embodiment, it is possible, by calculating the respective items of adjustment information of the A/D converter and D/A converter, to easily determine the A/D converter or D/A converter which is defective, meaning that it is possible to obtain the same advantages as in the first embodiment.

A method of adjusting the physical quantity sensor device described in the embodiments can be realized by executing a program, prepared in advance, with a computer, such as a personal computer or a workstation. The program is executed by being recorded in a computer readable recording medium, such as a solid state drive (SSD), a hard disk, a flexible disk, a CD-ROM, an MO, or a DVD, and retrieved from the recording medium by a computer. Also, the program may be a transmission medium which can be distributed via a network such as the Internet.

In the above, the invention, not being limited to the heretofore described embodiments, can be variably modified. For example, the setting device for calculating the correction parameter may be provided in the physical quantity sensor device. In this case, a configuration may be adopted such that the correction parameter is calculated again by the setting device, for example, when the peripheral device is changed in the operation mode 3 of the physical quantity sensor device. Also, the physical quantity sensor and another device (an output value correction device of the physical quantity sensor), of the physical quantity sensor device, may be provided on the same semiconductor chip, or may be provided on respective different semiconductor chips. When the physical quantity sensor and the output value correction device of the physical quantity sensor are provided on respective different semiconductor chips, the temperature sensor may be provided on the same semiconductor chip as the physical quantity sensor, or the temperature sensor is configured of a thermistor and does not have to be provided on the same semiconductor chip as the output value correction device of the physical quantity sensor and the physical quantity sensor. Also, the physical quantity sensor does not have to be provided on the semiconductor chip.

As in the above, the physical quantity sensor device, and the method of adjusting the physical quantity sensor device, according to the invention are useful for a physical quantity sensor device wherein a physical quantity, other than temperature, which depends on temperature is detected, and wherein after a characteristic variation of the detected physical quantity due to temperature or a characteristic variation of the peripheral device is corrected by a digital computation, a result of the computation is output in analog form.

What is claimed is:

1. A physical quantity sensor device, comprising:
    a physical quantity sensor which outputs an electrical signal corresponding to a detected physical quantity;
    an analog-to-digital (A/D) converter which converts an output value of the physical quantity sensor to digital;
    a computing section connected to an output of the A/D converter and which carries out a digital computation for correcting the output value of the physical quantity sensor, converted to digital by the A/D converter, to a predetermined value;
    a digital-to-analog (D/A) converter which converts a result computed by the digital computation to analog;
    an analog input/output section connected to an output of the D/A converter and which outputs an output value of the D/A converter to an exterior;
    a selector receiving as inputs an analog signal from the analog input/output section and the electrical signal from the physical quantity sensor, and having an output connected to the A/D converter, the selector configured to switch to selectively connect one of the analog input/output section or the physical quantity sensor to an input of the A/D converter to be converted by the A/D converter;
    a storage section connected to the computing circuit and the D/A converter, the storage section storing adjustment information of the A/D converter based on the initial output value of the A/D converter, converted to digital by the A/D converter from a predetermined analog signal that is input to the A/D converter from the analog input/output section; and
    a first correction section connected to the data storage section and the A/D converter, the first correction section for adjusting the output characteristic of the A/D converter on the basis of the adjustment information before the A/D converter converts the output value of the physical quantity sensor to digital.

2. The physical quantity sensor device according to claim 1, further comprising:
    an acquisition section which acquires an initial output value of the physical quantity sensor,
    wherein the computing section carries out the digital computation based on the initial output value of the physical quantity sensor converted to digital by the A/D converter.

3. The physical quantity sensor device according to claim 1, wherein
    the adjustment information is based on the error between the initial output characteristic of the A/D converter and a target output characteristic of the A/D converter.

4. The physical quantity sensor device according to claim 1, further comprising:
    a second correction section connected to the D/A converter for adjusting the output characteristic of the D/A converter on the basis of the adjustment information before the D/A converter converts the computed result to analog,
    wherein the storage section storing adjustment information based on the initial output characteristic of the D/A converter, converted to analog by the D/A converter from a predetermined digital signal that is input to the D/A converter from the exterior through the digital input/output section.

5. A physical quantity sensor device, comprising:
    a physical quantity sensor which outputs an electrical signal corresponding to a detected physical quantity;
    a A/D converter connected to an output of the physical quantity sensor and which converts an output value of the physical quantity sensor to digital;
    a computing section connected to an output of the A/D converter and which carries out a digital computation for correcting the output value of the physical quantity sensor, converted to digital by the A/D converter, to a predetermined value;
    a D/A converter which converts a result computed by the digital computation to analog;
    a digital input/output section connected to an output of the D/A converter and configured to communicate digitally with a device external to the physical quantity sensor device;
    a storage section connected to the computing circuit and the D/A converter, the storage section storing adjustment information based on the initial output characteristic of the D/A converter, converted to analog by the D/A converter from a predetermined digital signal that is input to the D/A converter from an exterior through the digital input/output section; and
    a first correction section connected to the D/A converter for adjusting the output characteristic of the D/A converter on the basis of the adjustment information before the D/A converter converts the computed result to analog.

6. The physical quantity sensor device according to claim 5, further comprising:
    an acquisition section which acquires an initial output value of the physical quantity sensor,
    wherein the computing section carries out the digital computation based on the initial output value of the physical quantity sensor converted to digital by the A/D converter.

7. A method for adjusting a physical quantity sensor device that includes: a physical quantity sensor which outputs an electrical signal corresponding to a detected physical quantity; an A/D converter which converts an output value of the physical quantity sensor to digital; a computing section connected to an output of the A/D converter and which carries out a digital computation for correcting the output value of the physical quantity sensor, converted to digital by the A/D converter, to a predetermined value; a D/A converter which converts a result computed by the digital computation to analog; and an analog input/output section which outputs an output value of the D/A converter to an exterior, the method for adjusting the physical quantity sensor device, comprising:

acquiring the initial output characteristic of the A/D converter by controlling a selector connected between the physical quantity sensor and the A/D converter to electrically connect the A/D converter to the analog input/output section and by converting a predetermined analog signal input from the analog input/output section to the A/D converter to digital through the A/D converter;

adjusting the output characteristic of the A/D converter on the basis of the initial output characteristic of the A/D converter before converting the output value of the physical quantity sensor to digital through the A/D converter;

switching the selector to connect the A/D converter to the physical quantity sensor; and converting the output value of the physical quantity sensor to digital through the A/D converter after electrically connecting the A/D converter to the physical quantity sensor by the selector and after adjusting the output characteristic of the A/D converter.

* * * * *